(12) United States Patent
Hellberg

(10) Patent No.: US 10,193,503 B2
(45) Date of Patent: Jan. 29, 2019

(54) AMPLIFIER CIRCUIT AND METHOD

(71) Applicant: Telefonaktiebolaget LM Ericsson (publ), Stockholm (SE)

(72) Inventor: Richard Hellberg, Huddinge (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/513,283

(22) PCT Filed: Oct. 6, 2014

(86) PCT No.: PCT/SE2014/051158
§ 371 (c)(1),
(2) Date: Mar. 22, 2017

(87) PCT Pub. No.: WO2016/056953
PCT Pub. Date: Apr. 14, 2016

(65) Prior Publication Data
US 2017/0250657 A1    Aug. 31, 2017

(51) Int. Cl.
*H03F 1/02* (2006.01)
*H03F 3/60* (2006.01)
(Continued)

(52) U.S. Cl.
CPC ............. *H03F 1/0288* (2013.01); *H03F 1/56* (2013.01); *H03F 3/19* (2013.01); *H03F 3/21* (2013.01);
(Continued)

(58) Field of Classification Search
USPC ................ 330/295, 124 R, 84, 286
See application file for complete search history.

(56) References Cited

U.S. PATENT DOCUMENTS 8,274,332 B2 * 9/2012 Cho .................. H03F 1/0261
330/124 R
2010/0176885 A1   7/2010 Kim et al.

FOREIGN PATENT DOCUMENTS

| EP | 1959563 A1 | 8/2008 |
|----|------------|--------|
| EP | 2475095 A1 | 7/2012 |
| WO | 2010068152 A1 | 6/2010 |

OTHER PUBLICATIONS

Chireix, H., "High Power Outphasing Modulation", Proceedings of the Institute of Radio Engineers, vol. 23, No. 2, pp. 1370-1392, Nov. 1935.

(Continued)

*Primary Examiner* — Hieu Nguyen
(74) *Attorney, Agent, or Firm* — Coats & Bennett, PLLC

(57) ABSTRACT

An amplifier arrangement comprises N amplifier stages ($10_1$ to $10_N$). The amplifier arrangement comprises a main cascade of quarter wavelength transmission lines coupled between an output of a main amplifier ($10_2$) of the N amplifier stages ($10_1$ to $10_N$) and an output node (15) of the amplifier arrangement, wherein the main cascade comprises N−1 quarter wavelength transmission lines ($11_1$ to $11_{N-1}$). An output of one peaking amplifier ($10_N$) of the N amplifier stages is coupled to the output node (15), and remaining peaking amplifiers ($10_1$, $10_3$ to $10_{N-1}$) of the N amplifier stages coupled to respective junctions ($12_1$ to $12_{N-2}$) in the main cascade of quarter wavelength transmission lines ($11_1$ to $11_{N-1}$). The amplifier arrangement is further configured such that at least one of the quarter wavelength transmission lines in the main cascade is extended by a half wavelength transmission line (13) or multiples of half wavelength transmission lines, and/or at least one of the peaking amplifiers ($10_{-1}$, $10_3$ to $10_N$) is coupled to its respective junction or output node (15) via a connecting half wavelength trans- (Continued)

mission line (13) or multiples of half wavelength transmission lines.

19 Claims, 31 Drawing Sheets

(51) Int. Cl.
H03F 3/21 (2006.01)
H03F 1/56 (2006.01)
H03F 3/19 (2006.01)
H03F 3/24 (2006.01)

(52) U.S. Cl.
CPC ............... *H03F 3/24* (2013.01); *H03F 3/605* (2013.01); *H03F 2200/405* (2013.01); *H03F 2200/423* (2013.01); *H03F 2200/451* (2013.01)

(56) References Cited

OTHER PUBLICATIONS

Doherty, W.H., "A New High Efficiency Power Amplifier for Modulated Waves", vol. 24, No. 9, pp. 1163-1182, Sep. 1936.

* cited by examiner

AMPLIFIER CIRCUIT AND METHOD

TECHNICAL FIELD

The present invention relates to an amplifier circuit and method, and more particularly to an amplifier circuit and method which provides improved efficiency.

BACKGROUND

In radio base stations and other systems, power amplifiers are often used to amplify wideband signals or signal combinations with high peak to average power ratio (PAR or PAPR). The amplifiers must then be able to repeatedly output very high power for very short periods, even though the bulk of the output power is generated at the much lower average power level. In systems with random phase combinations of many signals (without any dominating ones) the amplitude of the signal follows a Rayleigh distribution.

A conventional single-transistor power amplifier (for example a class B, AB or F power amplifier) has a fixed radio frequency (RF) load resistance and a fixed voltage supply. The bias in class B or AB amplifiers causes the output current to have a form close to that of a pulse train of half wave rectified sinusoid current pulses. The direct current (DC) current (and hence DC power) is therefore largely proportional to the RF output current amplitude (and voltage). The output power, however, is proportional to the RF output current squared. The efficiency, i.e. output power divided by DC power, is therefore also proportional to the output amplitude. While efficiency is high at the highest output powers, the average efficiency of a power amplifier is consequently low when amplifying signals that on average have a low output amplitude (or power) compared to the maximum required output amplitude (or power), i.e. high PAR.

A Chireix amplifier (as described in "High power outphasing modulation," Proc. IRE, vol. 23, no. 11, pp. 1370-1392, November 1935, by H Chireix), or a Doherty amplifier (as described in "A new high efficiency power amplifier for modulated waves", by W. H. Doherty, Proc. IRE, vol. 24, no. 9, pp. 1163-1182, September 1936) were the first examples of amplifiers based on multiple transistors with passive output network interaction and combination.

They have high average efficiency for amplitude-modulated signals with high peak-to-average ratio (PAR) since they have a much lower average sum of RF output current magnitudes from the transistors at low amplitudes. This causes high average efficiency since the DC currents drawn by the transistors are largely proportional to the RF current magnitudes.

The reduced average output current is obtained by using two transistors that influence each other's output voltages and currents through a reactive output network (that is also coupled to the load). By driving the constituent transistors with the appropriate amplitudes and phases, the sum of RF output currents is reduced at all levels except the maximum. Also for these amplifiers the RF voltage at one or both transistor outputs is increased.

In 2001 the author of the present application invented two-stage high efficiency amplifiers with increased robustness against circuit variations and with radically increased bandwidth of high efficiency, as disclosed in patent number WO2003/061115 by the present application. A wideband amplifier (100% relative bandwidth, i.e. having a 3:1 high band edge to low band edge ratio) has been successfully implemented by the present applicants. The central mode of such an amplifier is a wideband Doherty mode.

By designing similar networks with more amplifiers and with transmission line networks with longer maximum electrical length, even wider bandwidths can be achieved, as shown for example in co-pending patent application number PCT/SE2013/051217 by the present Applicant. These amplifiers have a large total bandwidth of high efficiency even with small numbers of sub-amplifiers, for example even with three or four sub-amplifiers.

Wideband Doherty amplifiers are a subject of much interest, and many approaches have been attempted. For example, using a quarter wavelength transmission line with the same impedance as the load results in wideband efficiency at the transition point, as disclosed in a paper by D Gustafsson et al., entitled "Theory and design of a novel wideband and reconfigurable high average efficiency amplifier, Proc. IMS 2012.

The wideband multistage amplifiers WO2003/061115 or PCT/SE2013/051217 have different operating modes in different frequency bands, which has the disadvantage of complicating the input drive circuits. The central Doherty mode of WO2003/061115 can be up to about 60% wideband, but the transition point amplitude then varies considerably within the bandwidth.

A Doherty amplifier that has a quarter wavelength line with the same impedance as the load, for example as disclosed in the paper mentioned above by Gustafsson, has the disadvantage of requiring a different supply voltage to each of the two sub-amplifiers. This results in an oversized and underutilized main transistor in case the same technology is used for both sub-amplifiers. The wideband efficiency at the transition point is obtained by sacrificing both wideband transistor utilization and efficiency at maximum power, which reduces the bandwidth of high average efficiency as well as increases transistor cost.

Using an LC-resonator, for example as disclosed in a paper by M Naseri Ali Abadi et al., entitled "An Extended Bandwidth Doherty Power Amplifier using a Novel Output Combiner", Proc. IMS 2014, or using a resonant stub at the output node has the drawback of decreasing the full power bandwidth and efficiency bandwidth at full power (as opposed to the technique of WO2003/061115 that does not have this drawback).

Furthermore, using another technique involving the use of a multi-section branch line coupler has limitations in the efficiency bandwidth both at the transition point and at full power, and also power bandwidth at full power, at least in its present realizations as disclosed in a paper by Piazzon et al., entitled "A method for Designing Broadband Doherty Power Amplifiers". Progress in Electromagnetics Research, Vol. 145, pp 319-331, 2014, or in a paper by R Giofrè et al., entitled "A Distributed Matching/Combining Network Suitable to Design Doherty Power Amplifiers Covering More Than an Octave Bandwidth", Proc. IMS 2014 (Based on abstract).

SUMMARY

It is an aim of the present invention to provide a method and apparatus which obviate or reduce at least one or more of the disadvantages mentioned above.

According to a first aspect of the present invention there is provided an amplifier arrangement comprising N amplifier stages. The amplifier arrangement comprises a cascade of quarter wavelength transmission lines, wherein the amplifier arrangement comprises a main amplifier and a plurality of peaking amplifiers adapted to operate in a Doherty mode of operation. The amplifier arrangement is further configured such that at least two peaking amplifiers are collectively driven by time-delayed versions of the same signal. At least one of the quarter wavelength transmission lines in the main cascade is extended by a half wavelength transmission line or multiples of half wavelength transmission lines, and/or at least one of the peaking amplifiers is coupled to its respective junction or output node via a connecting half wavelength transmission line or multiples of half wavelength transmission lines.

According to another aspect of the present invention there is provided a method of improving the efficiency of an amplifier arrangement comprising N amplifier stages coupled to an output impedance network comprising a cascade of quarter wavelength transmission lines, wherein the amplifier comprises a main amplifier and a plurality of peaking amplifiers adapted to operate in a Doherty mode of operation. The method comprises driving at least two peaking amplifiers by time-delayed versions of the same signal. The method further comprises extending at least one of the quarter wavelength transmission lines in the main cascade by a half wavelength transmission line or multiples of half wavelength transmission lines, and/or coupling at least one of the peaking amplifiers to its respective junction or output node via a connecting half wavelength transmission line or multiples of half wavelength transmission lines.

BRIEF DESCRIPTION OF THE DRAWINGS

For a better understanding of examples of the present invention, and to show more clearly how the examples may be carried into effect, reference will now be made, by way of example only, to the following drawings in which:

FIG. 1c shows the required relative phase angle variation for the embodiment of FIG. 1a;

FIG. 1d shows the efficiency at the transition point peaks for the circuit of FIG. 1a;

FIG. 1e shows class B efficiency curves for the circuit of FIG. 1a;

FIG. 3b shows the variation in transition point amplitude for the embodiment of FIG. 3a;

FIG. 3c the efficiency at the transition point peaks for the embodiment of FIG. 3a;

FIG. 3d shows the required relative phase angle variation for the embodiment of FIG. 3a;

FIG. 4 shows class B efficiency curves for the amplifier arrangement of FIG. 3a;

FIG. 5b shows the variation in transition point amplitude for the embodiment of FIG. 5a;

FIG. 5c shows the efficiency at the transition point peaks for the embodiment of FIG. 5a;

FIG. 5d shows the required relative phase angle variation for the embodiment of FIG. 5a;

FIG. 6 shows class B efficiency curves for the amplifier arrangement of FIG. 5a;

FIG. 7b shows the variation in transition point amplitude for the embodiment of FIG. 7a;

FIG. 7c shows the efficiency at the transition point peaks for the embodiment of FIG. 7a;

FIG. 7d shows the required relative phase angle variation for the embodiment of FIG. 7a;

FIG. 8a shows class B efficiency curves for the amplifier arrangement of FIG. 7a;

FIG. 8b shows RF current amplitudes for the amplifier arrangement of FIG. 7a;

FIG. 8c shows RF voltage waveforms of the amplifier arrangement of FIG. 7a;

FIG. 9b shows the variation in transition point amplitude for the embodiment of FIG. 9a;

FIG. 9c shows the efficiency at the transition point peaks for the embodiment of FIG. 9a;

FIG. 9d shows the required relative phase angle variation for the embodiment of FIG. 9a;

FIG. 10b shows the variation in transition point amplitude for the embodiment of FIG. 10a;

FIG. 10c shows the efficiency at the transition point peaks for the embodiment of FIG. 10a;

FIG. 10d shows the required relative phase angle variation for the arrangement of FIG. 10a;

FIG. 11b shows the variation in transition point amplitude for the embodiment of FIG. 11a;

FIG. 11c shows the efficiency at the transition point peaks for the embodiment of FIG. 11a;

FIG. 11d shows the required relative phase angle variation for the embodiment of FIG. 11a;

FIG. 12b shows the variation in transition point amplitude for the embodiment of FIG. 12a;

FIG. 12c shows the efficiency at the transition point peaks for the embodiment of FIG. 12a;

FIG. 12d shows the required relative phase angle variation for the embodiment of FIG. 12a;

FIG. 13b shows the variation in transition point amplitude for the embodiment of FIG. 13a;

FIG. 13c shows the efficiency at the transition point peaks for the embodiment of FIG. 13a;

FIG. 13d shows the required relative phase angle variation for the embodiment of FIG. 13a;

FIG. 14b shows the variation in transition point amplitude for the embodiment of FIG. 14a;

FIG. 14c shows the efficiency at the transition point peaks for the embodiment of FIG. 14a;

FIG. 14d shows the required relative phase angle variation for the embodiment of FIG. 14a;

FIG. 15b shows the variation in transition point amplitude for the embodiment of FIG. 15a;

FIG. 15c shows the efficiency at the transition point peaks for the embodiment of FIG. 15a;

FIG. 15d shows the required relative phase angle variation for the embodiment of FIG. 15a;

FIG. 16b shows RF current for the embodiment of FIG. 16a;

FIG. 16c shows RF voltage for the embodiment of FIG. 16a;

FIG. 16d shows efficiency for the embodiment of FIG. 16a;

FIG. 16e shows RF current phase for the embodiment of FIG. 16a; and

FIG. 16f shows RF Voltage phase for the embodiment of FIG. 16a.

DETAILED DESCRIPTION

Figure 1A:
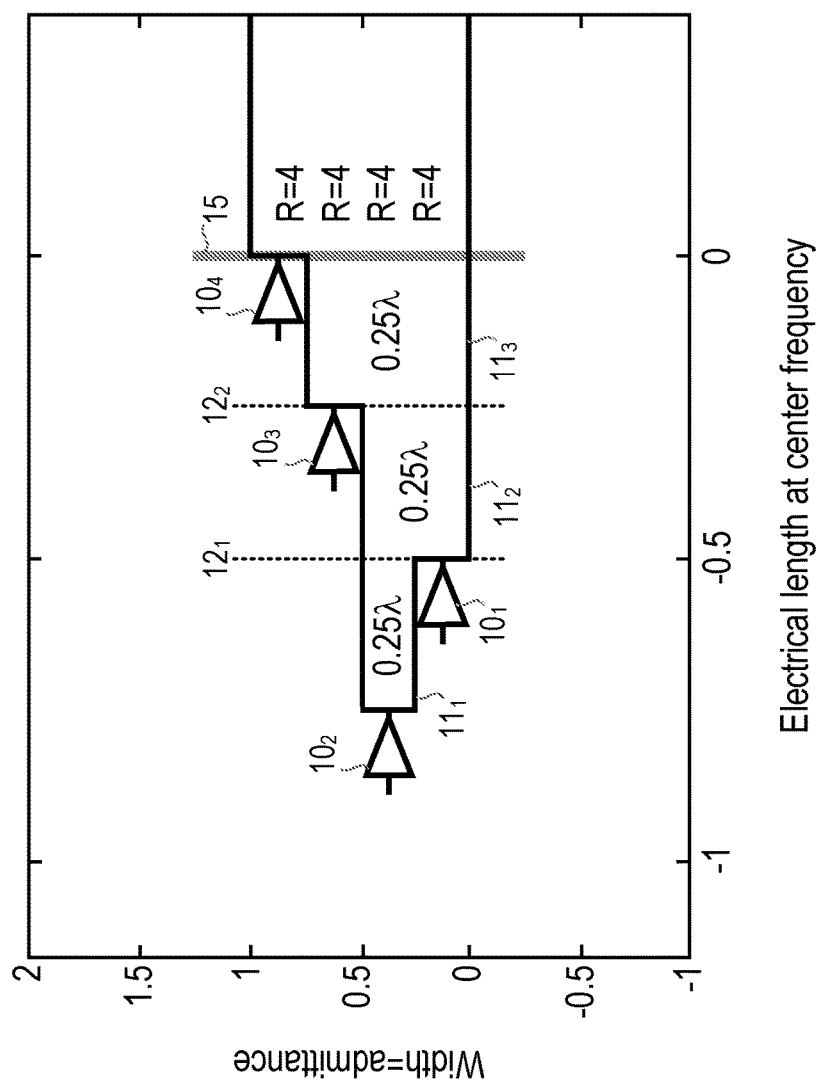
FIG. 1a shows an example of a known four-stage amplifier circuit.

FIG. 1a shows an example of a known, unmodified four-stage amplifier arrangement with equal-size sub-amplifiers (i.e. amplifier stages $10_1$ to $10_4$). The amplifier arrangement comprises a main cascade of quarter wavelength transmission lines $11_1$ to $11_3$ coupled between an output of one of the four sub-amplifiers or amplifier stages ($10_2$ in this example, also referred to as the "main" amplifier) and an output node 15 of the amplifier arrangement.

One amplifier, for example the last amplifier stage, also known as the last peaking amplifier (i.e. the fourth amplifier stage $10_4$ of this example) is coupled to the output node 15. The output of the main amplifier (i.e. the second amplifier stage $10_2$ of this example) is coupled to the input of first section $11_1$ of the main cascade of quarter wavelength transmission lines. The remaining peaking amplifiers, for example the first and third peaking amplifiers (i.e. the first amplifier stage $10_1$ and the third amplifier stage $10_3$ of this example) are coupled to respective junctions $12_1$ and $12_2$ in the main cascade of quarter wavelength transmission lines $11_1$ to $11_3$.

This type of amplifier arrangement is about optimal for 9 dB peak to average ratio (PAR) Rayleigh distributed amplitude signals. The target bandwidth is 50% (0.75 to 1.25 of center frequency).

Figure 1B:
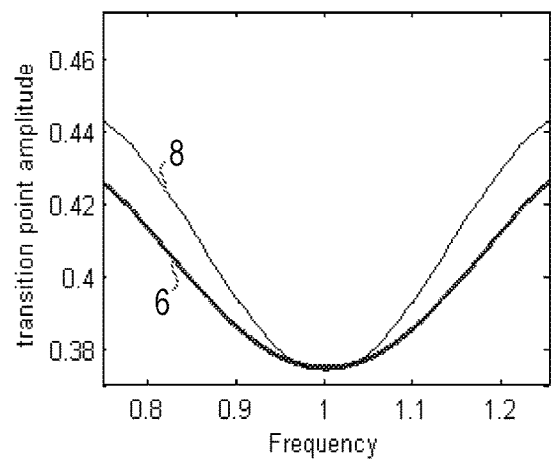
FIG. 1b shows the variation in transition point amplitude.
Figure 1C:
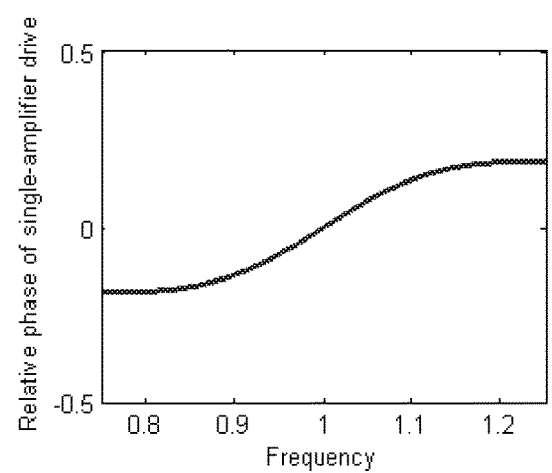
Figure 1D:
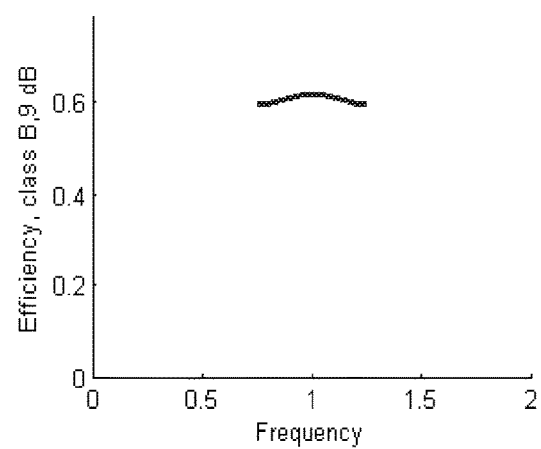

With such an amplifier arrangement, the transition point varies between just below 0.38 to almost 0.43 within the 50% bandwidth, as illustrated by the curve labeled 6 in FIG. 1b. The deviation of the curve labeled 8 from the curve labeled 6 in FIG. 1b shows that the high-efficiency low-amplitude range is terminated at a too low amplitude due to extra voltage at the main transistor output coming from series reactance. The required phase angle for the main sub-amplifier, relative to the in-phase combination phase, at the transition point varies between −0.2 and 0.2 radians, as illustrated in FIG. 1c. The average efficiency with correct drive, as illustrated in FIG. 1d, is close to optimal in the middle (i.e. around centre frequency) but drops towards the edges (even with transition-point following input side arrangements).

Figure 1E:
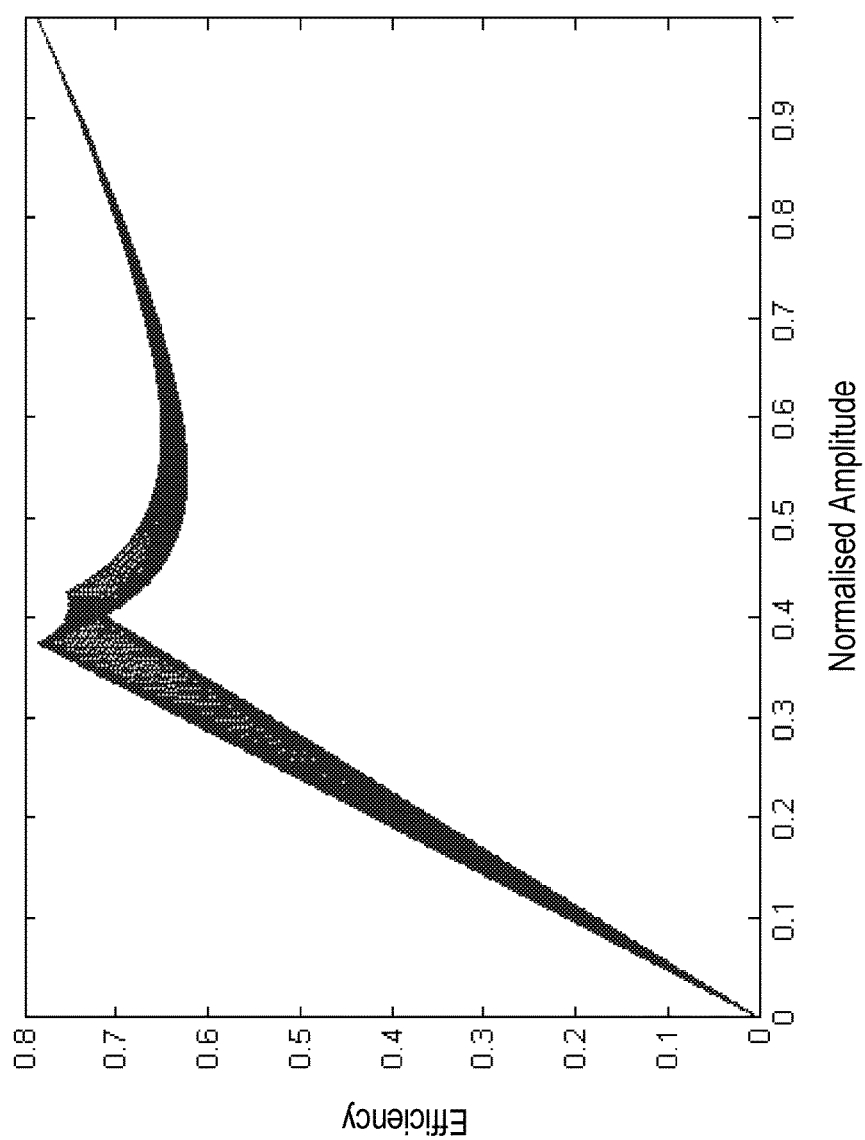

FIG. 1e illustrates class B efficiency curves within the bandwidth, which again show that the transition point amplitude varies quite considerably, and the efficiency at the transition point is lower than optimal towards the edges.

As will be described in greater detail below, the embodiments of the present invention provide a method to construct moderately wideband amplifiers, for example Doherty amplifiers. The amplifier arrangements described in the embodiments herein may be used as stand-alone methods to obtain consistent properties over the band when arbitrarily sized transistors are not available (for example when only one size is available), and may also be used to absorb parasitic components.

According to one aspect, a method consists of inserting half wavelength lines in a multistage Doherty amplifier structure, together with using the peaking amplifiers collectively for in-phase combining to yield maximum output power, for example by collectively driving at least two peaking amplifiers with time-delayed versions of the same signal. The half wavelength lines may be connected between a sub-amplifier and the main Doherty quarter wavelength cascade, and/or be added to one or more quarter wavelength lines in that cascade, as will be described in further detail in the embodiments below. It is noted that these extensions do not change the operation in the middle of the band, but add frequency-dependent reactive components at the junctions that can make the quarterwave stepped transformer action more wideband in the sense of having a high-efficiency transition point with small amplitude variations (ripple) within the bandwidth.

Figure 2:
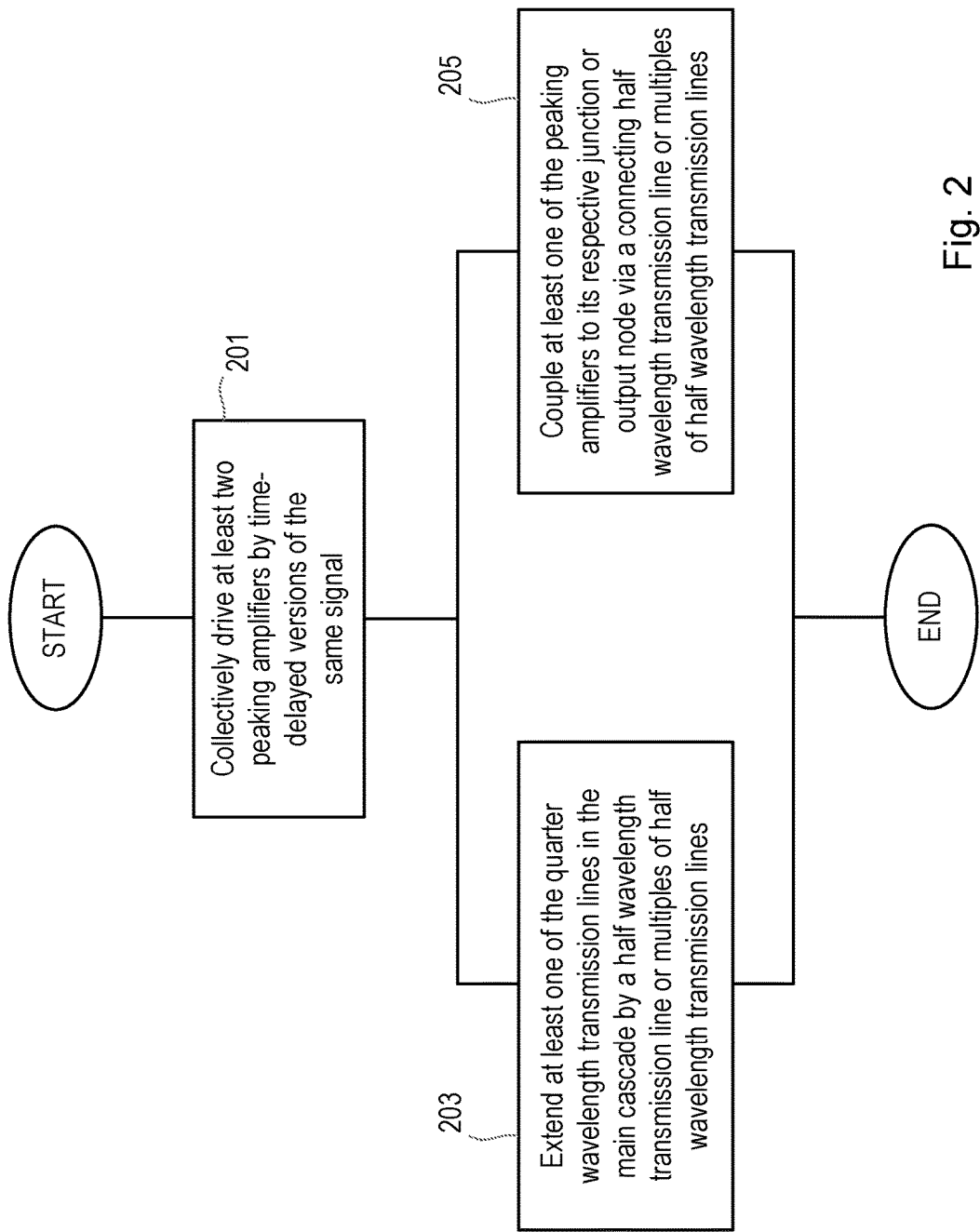
FIG. 2 shows a method according to an embodiment of the present invention.

FIG. 2 shows a method according to an embodiment of the present invention. The method is for use in an amplifier arrangement comprising N amplifier stages coupled to an output impedance network comprising a cascade of quarter wavelength transmission lines, wherein the amplifier arrangement comprises a main amplifier and a plurality of peaking amplifiers adapted to operate in a Doherty mode of operation. In such an amplifier arrangement, the method comprises the step of collectively driving at least two peaking amplifiers by time-delayed versions of the same signal, step 201, and extending at least one of the quarter wavelength transmission lines in the main cascade by a half wavelength transmission line or multiples of half wavelength transmission lines, step 203, and/or coupling at least one of the peaking amplifiers to its respective junction or output node via a connecting half wavelength transmission line or multiples of half wavelength transmission lines, step 205. It is noted that steps 203 and 205 can therefore be carried out independently or in combination.

It is also noted that the amplifier arrangement may comprise three or more amplifier stages.

Figure 3A:
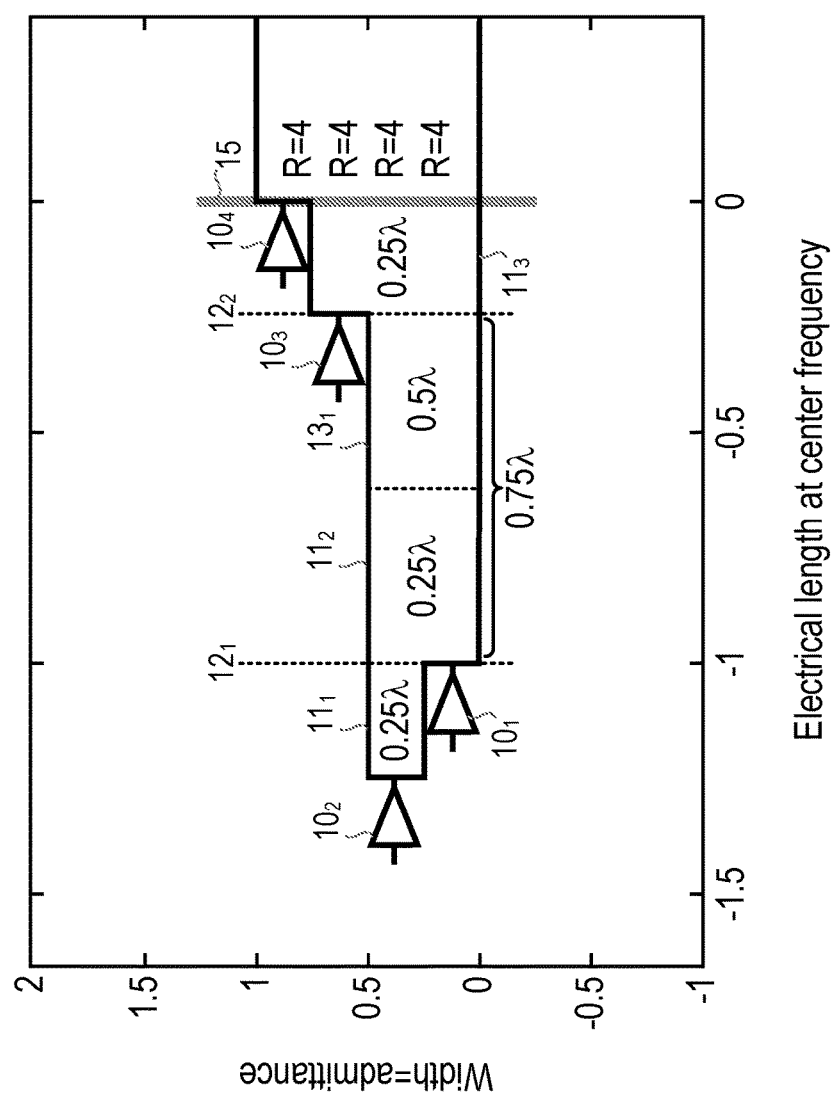
FIG. 3a shows an example of an amplifier arrangement according to another embodiment.

FIG. 3a shows an example of a four-stage amplifier arrangement according to an embodiment of the invention. At least two peaking amplifiers are configured to be driven by time-delayed versions of the same signal. The four-stage amplifier arrangement comprises equal sized sub-amplifiers (i.e. amplifier stages $10_1$ to $10_4$ have substantially equal size). The amplifier arrangement comprises a main cascade of quarter wavelength transmission lines $11_1$ to $11_3$ coupled between an output of one of the four sub-amplifiers (amplifier stage $10_2$ in this example, also referred to as the "main" amplifier) and an output node 15 of the amplifier arrangement.

One amplifier, for example the last peaking amplifier (i.e. the fourth amplifier stage $10_4$ of this example) is coupled to the output node 15. Another amplifier, for example a second peaking amplifier (i.e. the second amplifier stage $10_2$ of this example) is coupled to the first section $11_1$ of the main cascade of quarter wavelength transmission lines. The remaining peaking amplifiers, for example the first and third peaking amplifiers (i.e. the first amplifier stage $10_1$ and the third amplifier stage $10_3$ of this example) are coupled to respective junctions $12_1$ and $12_2$ in the main cascade of quarter wavelength transmission lines $11_1$ to $11_3$.

According to this embodiment, the second quarter wavelength transmission line $11_2$ of the main cascade (between the junctions $12_1$ and $12_2$ where the peaking amplifiers $10_1$ and $10_3$ are coupled) is extended by a half wavelength transmission line $13_1$. In other words, this second section $11_2$ of the main cascade has a half wavelength extra compared to the unmodified amplifier of FIG. 1a, and is now three quarter wavelengths at center frequency.

It is noted that instead of an extension by half a wavelength, extension by multiples of half wavelength transmission lines may also be used, for example at center frequency. The additional transmission lines help pull up the frequency response where it would otherwise droop. This effect may generally increase with the distance from the center frequency, but also with the number of inserted half wavelength transmission lines. As such, a higher number can sometimes be preferable (for example in narrow band systems) to obtain a greater effect near center frequency.

Thus, in an example of an amplifier arrangement which comprises four amplifier stages $10_1$ to $10_4$, the second section $11_2$ of the main cascade of quarter wavelength transmission lines is extended by a half wavelength transmission line $13_1$ or multiples of half wavelength transmission lines. It is noted that other sections of the cascade may also be extended in this way, either in isolation or in combination. It is also noted that this extension of a section of the main cascade of quarter wavelength transmission lines may also be applied to amplifier arrangements having a different number of amplifier stages.

Figure 3B:
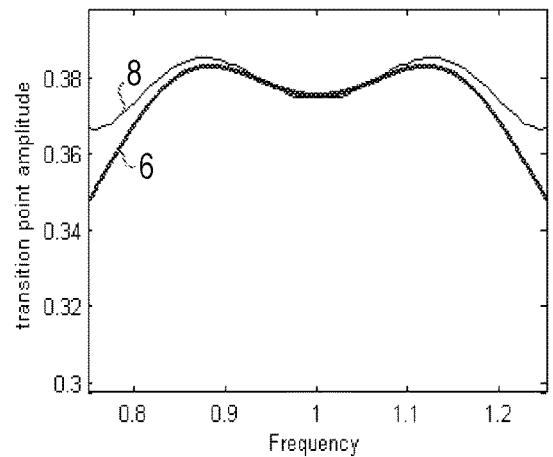
Figure 3C:
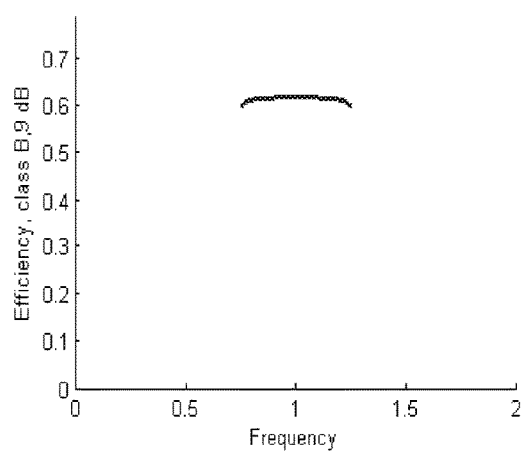
Figure 3D:
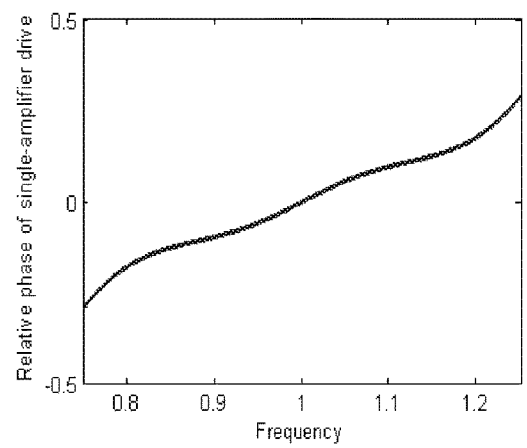
Figure 4:
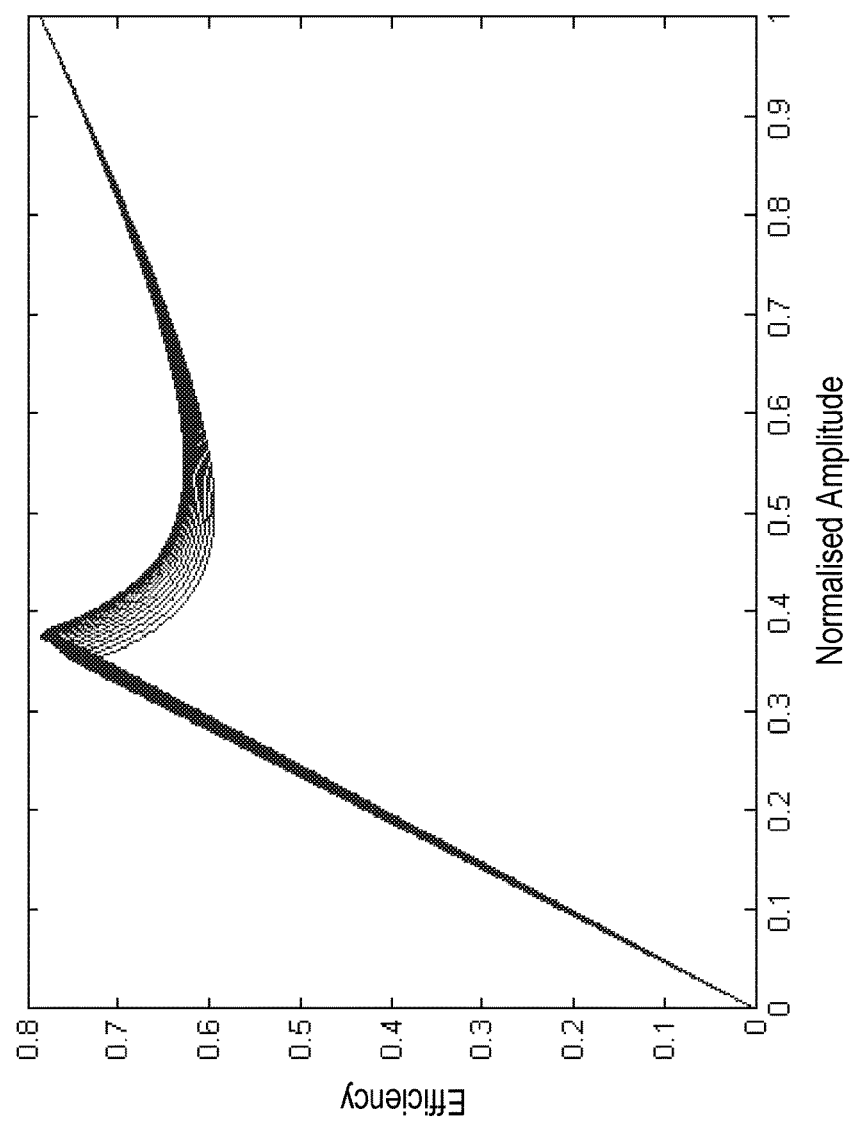

As can be seen from FIG. 3b, with such an amplifier arrangement the variation in transition point amplitude has decreased compared to the unmodified amplifier of FIG. 1a above. The efficiency at the transition point peaks are also closer to the maximum possible, while the required relative phase angle at the transition point has a somewhat larger maximum. It is noted that the amplifier arrangement of FIG. 3a is good on all these counts within about 40% bandwidth. The resulting average efficiency is closer to optimal over the whole bandwidth. The efficiency curves over the 50% bandwidth also show the improvement, as can also be seen from the class B efficiency curves of FIG. 4. It is noted that in FIG. 4 it can be seen that the slopes on the left of the efficiency curves are closer together (for example compared to FIG. 1e), which means that the efficiency at low amplitude is more consistent. The maximum efficiency (y-axis) assumes theoretical class B operation, therefore the maximum point is at 0.785 (78.5 efficiency). It is noted that the amplitude (x-axis) is normalized to a maximum output amplitude of 1.

Figure 5A:
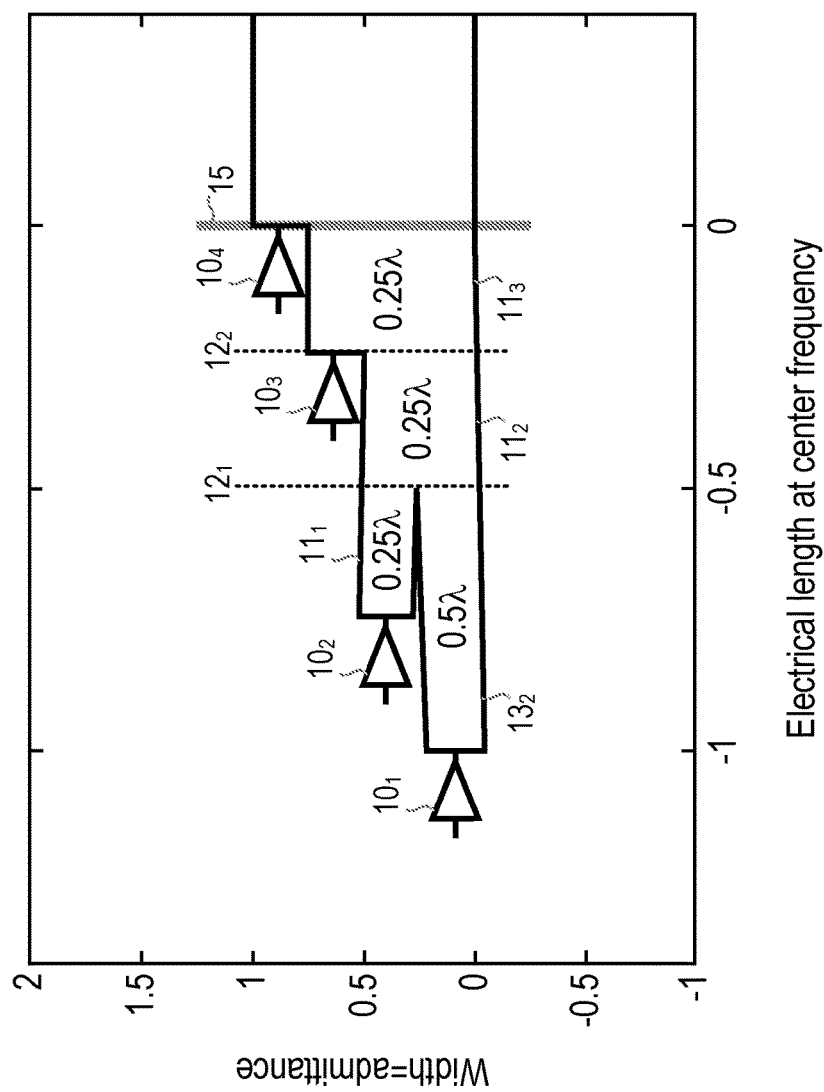
FIG. 5a shows an example of an amplifier arrangement according to another embodiment.

FIG. 5a shows another example of a four-stage amplifier arrangement according to an embodiment of the invention. At least two peaking amplifiers are configured to be driven by time-delayed versions of the same signal. The four-stage amplifier arrangement comprises equal-size sub-amplifiers (i.e. amplifier stages $10_1$ to $10_4$ have substantially equal size). The amplifier arrangement comprises a main cascade of quarter wavelength transmission lines $11_1$ to $11_3$ coupled between an output of one of the four sub-amplifiers ($10_2$ in this example) and an output node 15 of the amplifier arrangement.

One amplifier, for example the last peaking amplifier (i.e. the fourth amplifier stage $10_4$ of this example) is coupled to the output node 15. Another amplifier, for example the main amplifier (i.e. the second amplifier stage $10_2$ of this example) is coupled to the first section $11_1$ of the main cascade of quarter wavelength transmission lines. Another peaking amplifier, for example the peaking amplifier of the third amplifier stage $10_3$ is coupled to its respective junction $12_2$ in the main cascade of quarter wavelength transmission lines $11_1$ to $11_3$.

However, according to this embodiment, an extra half wavelength transmission line $13_2$ is inserted from a sub-amplifier, for example the first peaking amplifier of amplifier stage $10_1$, to its junction (junction $12_1$ in this example) in the main cascade of quarter wavelength transmission lines.

It is noted that instead of an extension by half a wavelength, multiples of half wavelength transmission lines may also be used.

Thus, in this amplifier arrangement comprising four amplifier stages $10_1$ to $10_4$, a first peaking amplifier, for example the first peaking amplifier $10_1$, is coupled to its respective junction of the main cascade of quarter wavelength transmission lines via a half wavelength transmission line $13_2$ or multiples of half wavelength transmission lines.

Figure 5B:
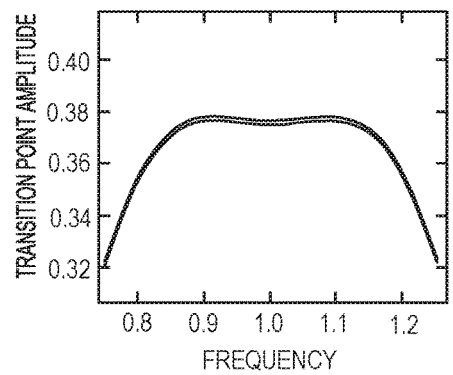
Figure 5C:
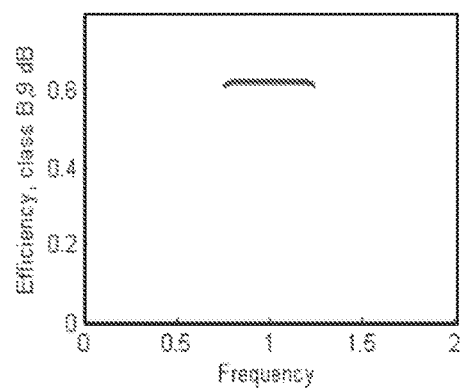
Figure 5D:
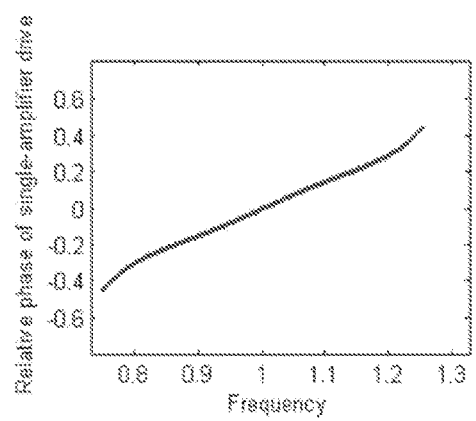

From FIG. 5b it can be seen that the maximum variation in transition point amplitude has this time not been decreased compared to the unmodified amplifier of FIG. 1a above. However, the behavior of the amplifier arrangement has been changed. From FIG. 5c it can be seen that the efficiency at the transition point peaks are very close to the maximum possible, which provides an improvement over the unmodified variant of FIG. 1a above (and provides a close to perfect efficiency within 30% relative bandwidth). From FIG. 5d it can be seen that the required relative phase angle at the transition point is increased.

Figure 6:
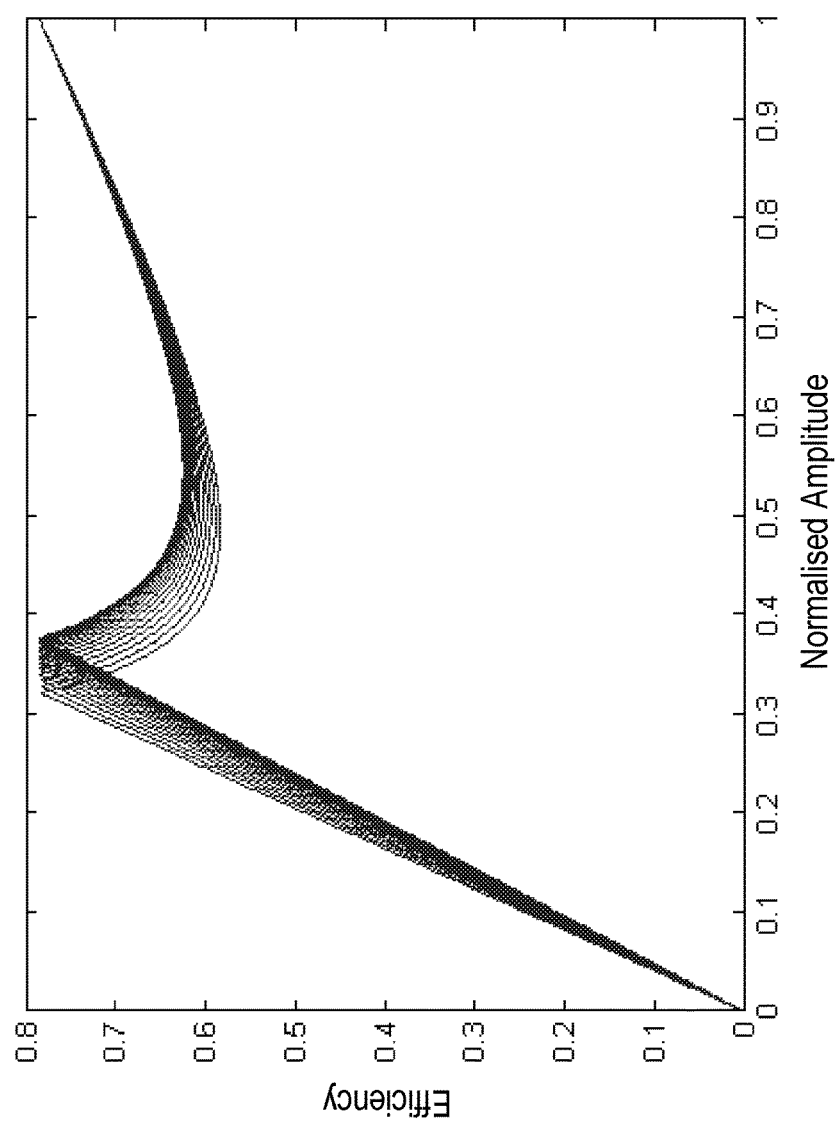

The class B efficiency curves over the 50% bandwidth show the improvement in transition point peak efficiency, as can be seen in FIG. 6.

It is noted that the insertion of the half wavelength transmission line may be applied to one or more of the other peaking amplifiers, for example as shown below in FIG. 7a.

Figure 7A:
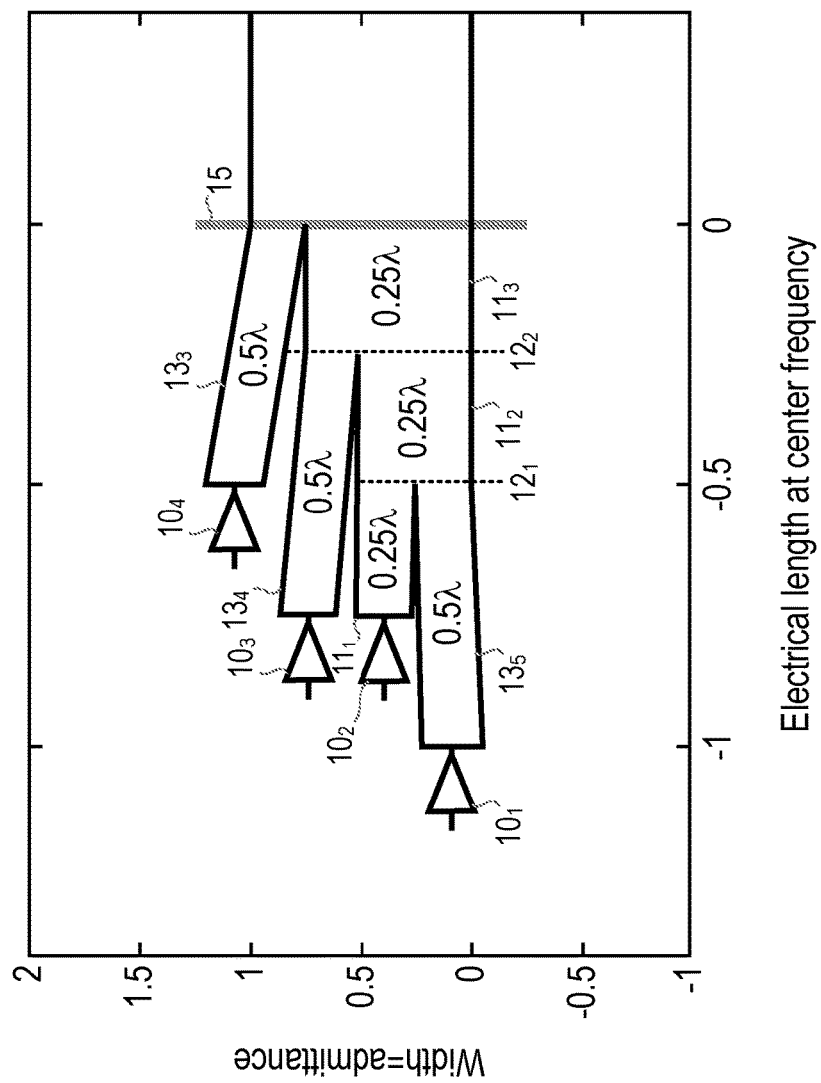
FIG. 7a shows an example of an amplifier arrangement according to another embodiment.

FIG. 7a shows an amplifier arrangement similar to the embodiment of FIG. 5a, but whereby a plurality of extra half wavelength transmission lines have been inserted. At least two peaking amplifiers are configured to be driven by time-delayed versions of the same signal.

In the example of FIG. 7a, it can be seen that a half wavelength transmission line is provided from each peaking amplifier $10_1$, $10_3$ and $10_4$ (shown as half wavelength transmission lines $13_5$, $13_4$ and $13_3$ respectively).

Thus, the four-stage amplifier arrangement comprises: a first peaking amplifier $10_1$ coupled to its respective junction of the main cascade of quarter wavelength transmission lines via a half wavelength transmission line $13_5$ or multiples of half wavelength transmission lines; a second peaking amplifier $10_3$ coupled to its respective junction of the main cascade of quarter wavelength transmission lines via a half wavelength transmission line $13_4$ or multiples of half wavelength transmission lines; and a third peaking amplifier $10_4$ coupled to the output 15 via a half wavelength transmission line $13_3$ or multiples of half wavelength transmission lines.

Figure 7B:
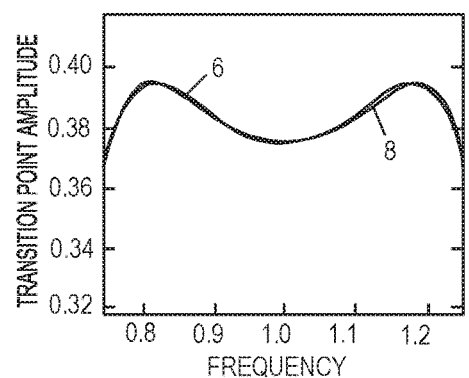
Figure 7C:
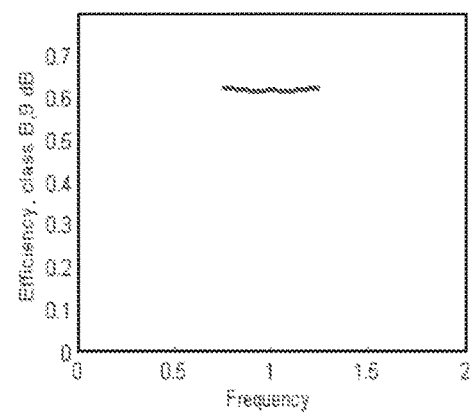
Figure 7D:
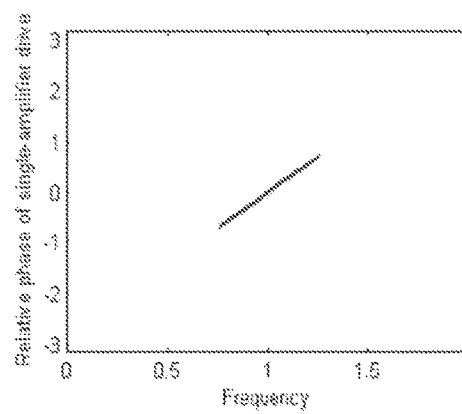

From FIG. 7b it can be seen that the variation in transition point amplitude has decreased compared to the unmodified amplifier of FIG. 1a above. From FIG. 7c it can be seen that the efficiency at the transition point peaks are very close to the maximum possible. From FIG. 7d it can be seen that the required relative phase angle variation at the transition point is increased so its change over frequency is now very close to that of a negative half-wavelength line. This has the advantage in that it can be achieved with relatively simple arrangements on the input side, for example as disclosed in co-pending application reference P43345 by the present Applicant. The variations in relative phase angle are then obtained, for example, by inserting the main sub-amplifier input signal component for the low amplitude range ("triangular amplitude signal") with an advance of a half wavelength compared to the in-phase combined component (the class C signal part).

Figure 8A:
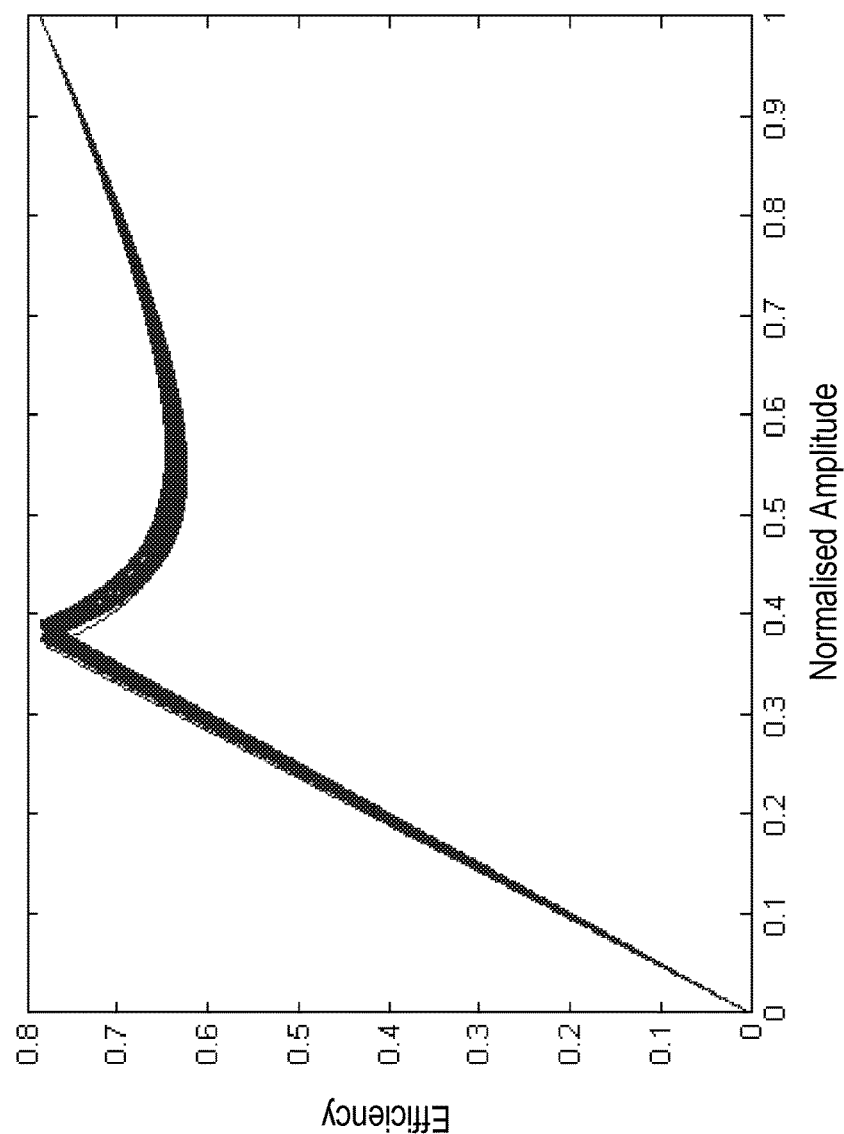
Figure 8B:
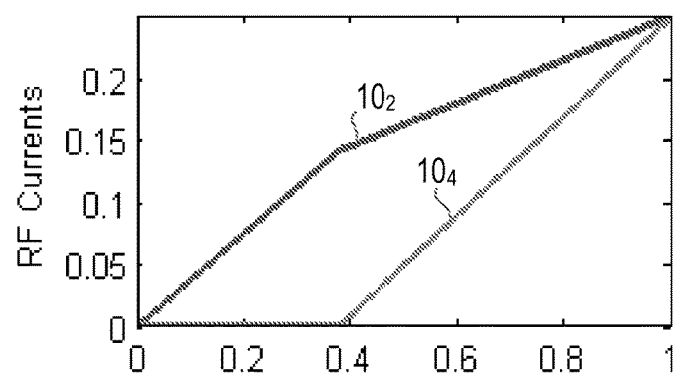
Figure 8C:
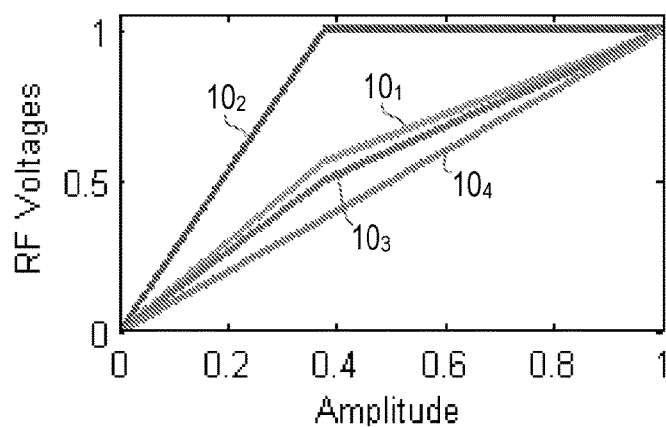

Referring to FIG. 8a, it can be seen that the class B efficiency curves over the 50% bandwidth show improvements in transition point peak efficiency and amplitude variations. FIG. 8b shows the RF current amplitudes and FIG. 8c the RF voltage amplitudes (both at center frequency, top traces in each are for the main sub-amplifier $10_2$).

The examples of FIGS. 5a and 7a are shown without having the modification of FIG. 3a to the main cascade. It is noted, however, that the two techniques may be used in any combination.

Thus, in general terms, an amplifier arrangement according to an embodiment of the present invention comprises N amplifier stages $10_1$ to $10_N$ coupled to an output impedance network comprising a cascade of quarter wavelength transmission lines, wherein the amplifier comprises a main amplifier and a plurality of peaking amplifiers adapted to operate in a Doherty mode of operation. The amplifier arrangement is adapted such that at least two peaking amplifiers are collectively driven by time-delayed versions of the same signal. The amplifier arrangement is further configured such that: at least one of the quarter wavelength transmission lines in the main cascade is extended by a half wavelength transmission line 13 or multiples of half wavelength transmission lines; and/or at least one of the peaking amplifiers $10_1$, $10_3$ to $10_N$ is coupled to its respective junction or output node 15 via a connecting half wavelength transmission line 13 or multiples of half wavelength transmission lines.

The output impedance network may comprise a cascade of quarter wavelength transmission lines coupled between an output of a main amplifier $10_2$ of the N amplifier stages $10_1$ to $10_N$ and an output node 15 of the amplifier arrangement, wherein the main cascade comprises N−1 quarter wavelength transmission lines $11_1$ to $11_{N-1}$. An output of one peaking amplifier $10_N$ of the N amplifier stages is coupled to the output node 15, and remaining peaking amplifiers $10_1$, $10_3$ to $10_{N-1}$ of the N amplifier stages coupled to respective junctions $12_1$ to $12_{N-2}$ in the main cascade of quarter wavelength transmission lines.

Various aspects of the invention may be combined in an amplifier arrangement.

Figure 9A:
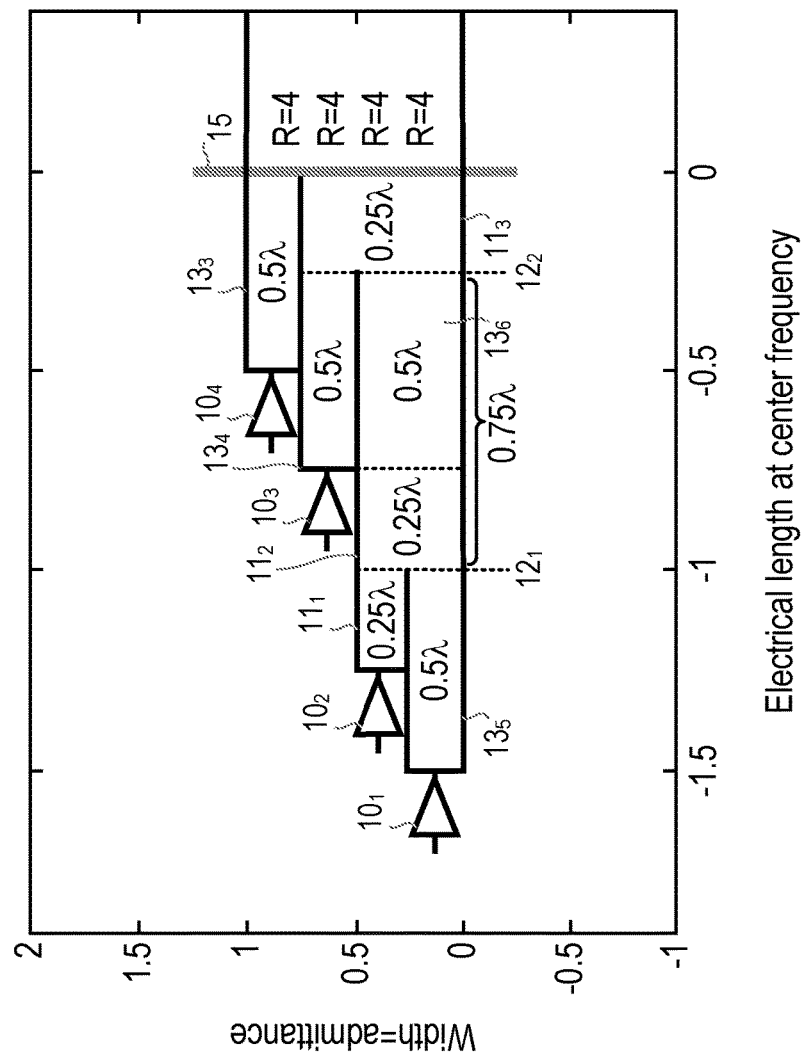
FIG. 9a shows an example of an amplifier arrangement according to another embodiment.

An example having combined features is shown in FIG. 9a which is a solution that may be provided, for example, for narrower bandwidths. FIG. 9a shows an example of a four-stage amplifier arrangement, with at least one half wavelength transmission line from each peaking amplifier (shown as half wavelength transmission lines $13_3$, $13_4$, $13_5$ from peaking amplifiers $10_4$, $10_3$ and $10_1$ respectively), and one half wavelength transmission line extension in the main cascade (for example shown as section $13_6$), which provides good performance within about 30% bandwidth. At least two peaking amplifiers are configured to be driven by time-delayed versions of the same signal.

Figure 9B:
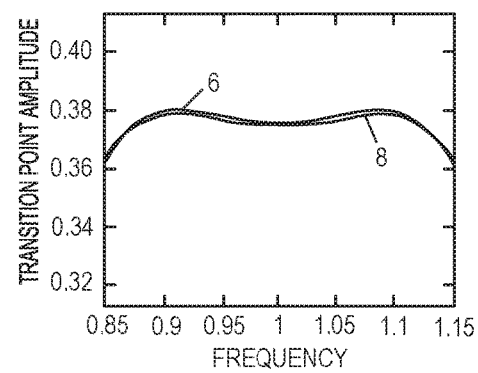
Figure 9C:
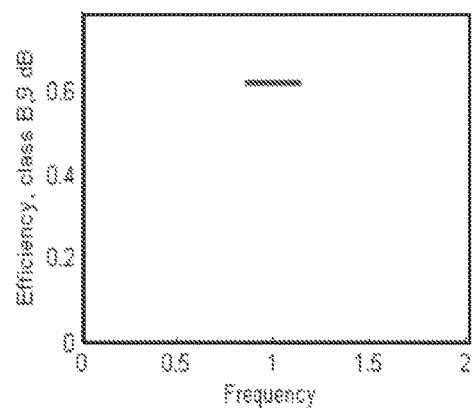
Figure 9D:
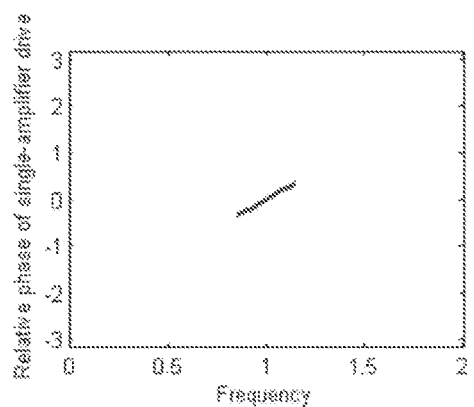

FIG. 9b shows the variation in transition point amplitude, FIG. 9c the efficiency at the transition point peaks and FIG. 9d the required relative phase angle variation for the embodiment of FIG. 9a.

In the embodiments described in the Figures above, each of the amplifiers in the N amplifier stages $10_1$ to $10_N$ is of a substantially equal size. It is noted that the size of an amplifier may be related to its RF current output.

Thus, according to one example the amplifiers are substantially equally sized. However, according to another example at least one amplifier is sized differently to the remaining amplifiers.

In these examples a characteristic impedance of each successive stage in the main cascade of quarter wavelength transmission lines $11_1$ to $11_{N-1}$ is reduced towards the output node in relation to the parallel combination of preceding connecting transmission lines, whereby an outgoing transmission line has an admittance that is the sum of all incoming admittances. In an example where "incoming" transmission lines to a junction have the same impedance, then a characteristic impedance of each successive stage in the main cascade of quarter wavelength transmission lines $11_1$ to $11_{N-1}$ is reduced towards the output node in relation to the parallel combination of preceding connecting transmission lines, and whereby the characteristic impedance of each successive stage is reduced to 1/M of the impedance of the transmission line from a single amplifier, whereby M relates to the number of preceding amplifiers.

Furthermore, in these examples the characteristic impedance of each of the half wavelength transmission lines 13 is shown as being substantially equal.

According to one example the impedance of each section of the cascade of quarter wavelength transmission lines is substantially equal. According to another example at least one section of the cascade of quarter wavelength transmission lines comprises an impedance which is different to the remaining sections of the cascade.

According to one example each of the peaking amplifiers $10_1$, $10_3$ to $10_N$ may be coupled to a respective junction or output node of the cascade via a connecting half wavelength transmission line 13 or multiples of half wavelength transmission lines.

Examples of embodiments with six amplifier stages will now be described.

First, FIGS. 10a to 10d relate to an unmodified six-stage amplifier arrangement (a 70% bandwidth is shown as reference for the first modified example that follows in FIGS. 11a to 11d).

Figure 10A:
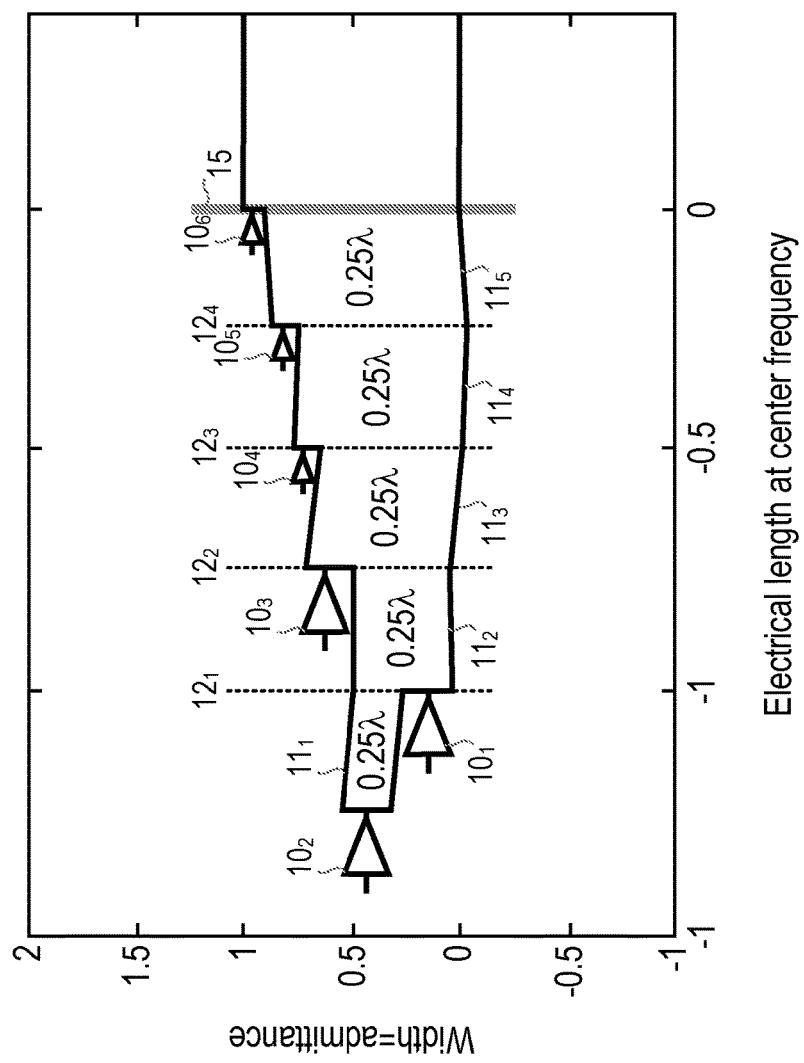
FIG. 10a shows an example of a known six-stage amplifier arrangement.

The unmodified example of FIG. 10a comprises a six-stage amplifier with two different size amplifier stages, in a 2:1 ratio. As mentioned above, it is noted that the size refers to the RF current output (which applies to other embodiments too). Since the maximum voltages are the same, higher output current means that the optimum load resistance is lower. In this example, the main amplifier $10_2$ and the first two peaking amplifiers $10_1$ and $10_3$ are twice the size as the three remaining peaking amplifiers $10_4$, $10_5$ and $10_6$, which gives about optimal transition point amplitude (at center frequency) for 9 dB peak to average ratio (PAR) Rayleigh distributed amplitude signals.

Figure 10B:
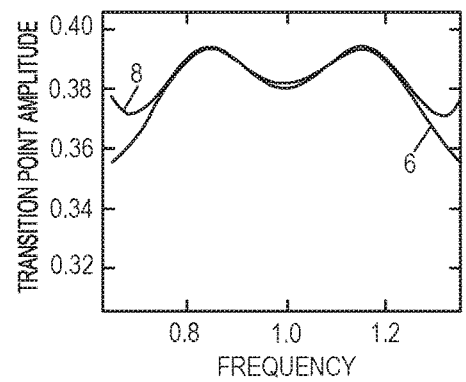
Figure 10C:
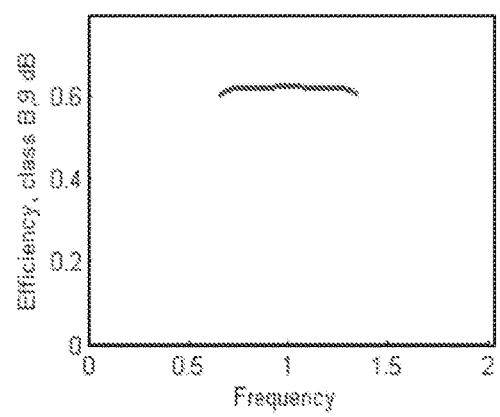
Figure 10D:
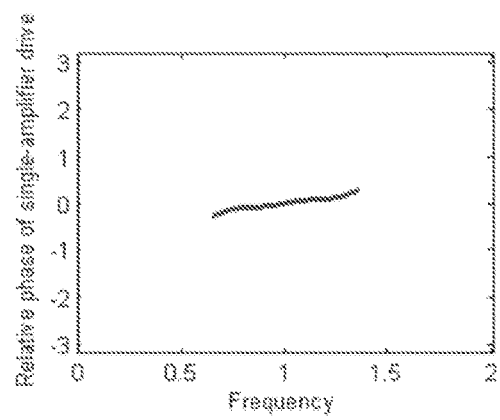

FIG. 10b shows the variation in transition point amplitude, FIG. 10c the efficiency at the transition point peaks and FIG. 10d the required relative phase angle variation for the embodiment of FIG. 10a.

Figure 11A:
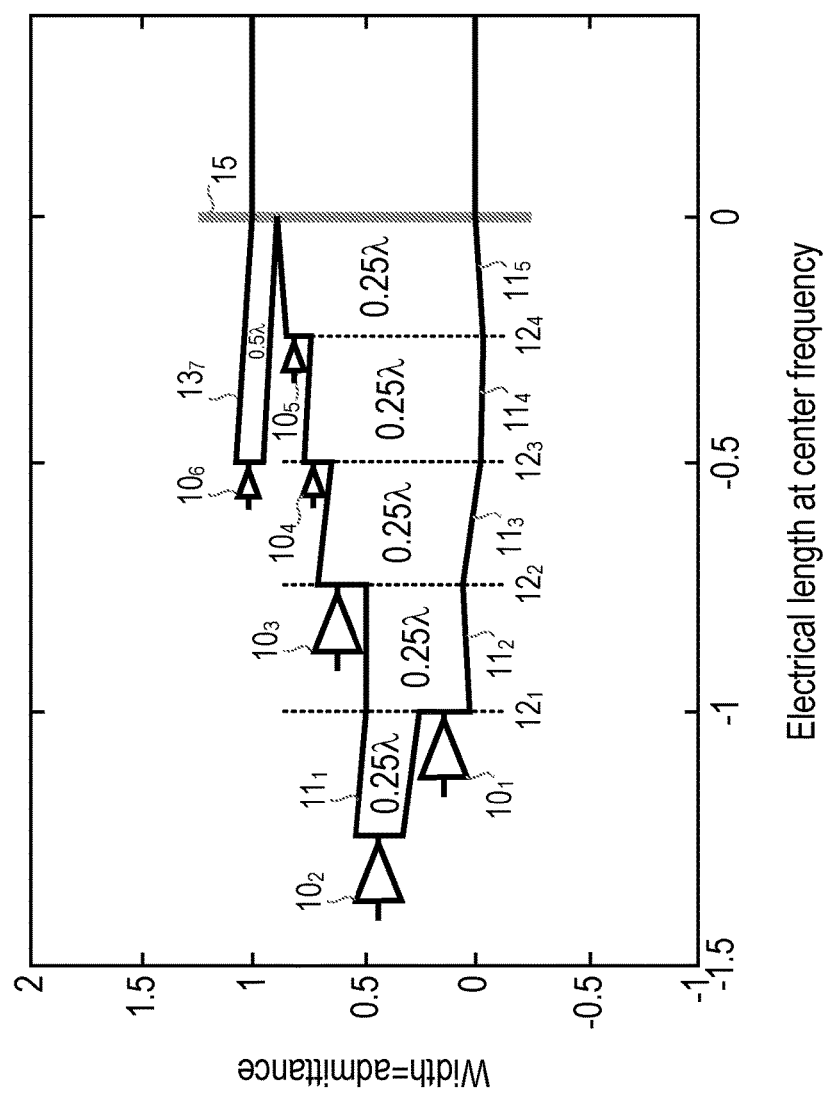
FIG. 11a shows an example of an amplifier arrangement according to another embodiment.
Figure 11B:
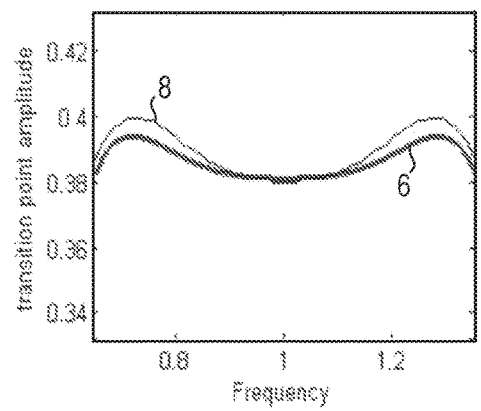
Figure 11C:
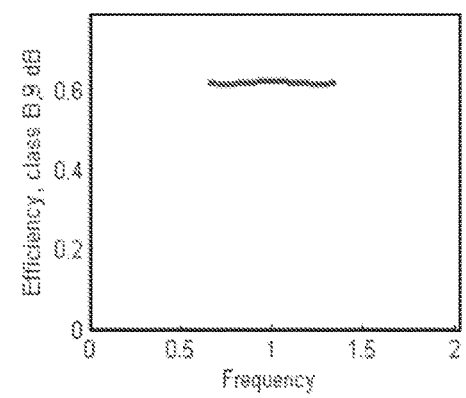
Figure 11D:
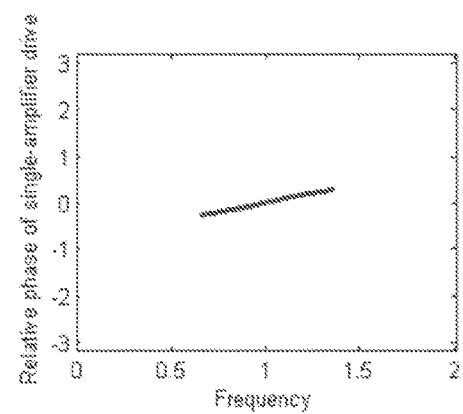

FIG. 11a shows an example of an embodiment of a six-stage amplifier arrangement. At least two peaking amplifiers are configured to be driven by time-delayed versions of the same signal. The six-stage amplifier comprises two different size amplifier stages, for example in a 2:1 ratio (the size relating to the RF current output). It is noted that other ratios may also be used. The amplifier arrangement comprises a main cascade of quarter wavelength transmission lines, the main cascade having five sections $11_1$ to $11_5$. In the embodiment of FIG. 11a, a half wavelength transmission line $13_7$ has been coupled between the last peaking sub-amplifier (i.e. amplifier stage $10_6$) and the output node 15. Adding just one half wavelength transmission line in this manner improves the response considerably, as shown in FIG. 11b which shows the variation in transition point amplitude. FIG. 11c shows the efficiency at the transition point peaks and FIG. 11d the required relative phase angle variation for the embodiment of FIG. 11a.

Thus, in this arrangement the amplifier comprises six amplifier stages $10_1$ to $10_6$, and the main cascade of quarter wavelength transmission lines comprises five stages $11_1$ to $11_5$, and wherein the main amplifier $10_2$ and the first and second peaking amplifiers $10_1$, $10_3$ are substantially double the size of the remaining peaking amplifiers $10_4$ to $10_6$, and wherein the fifth peaking amplifier $10_6$ is coupled to the output 15 via a half wavelength transmission line $13_7$, or multiples of half wavelength transmission lines.

Figure 12A:
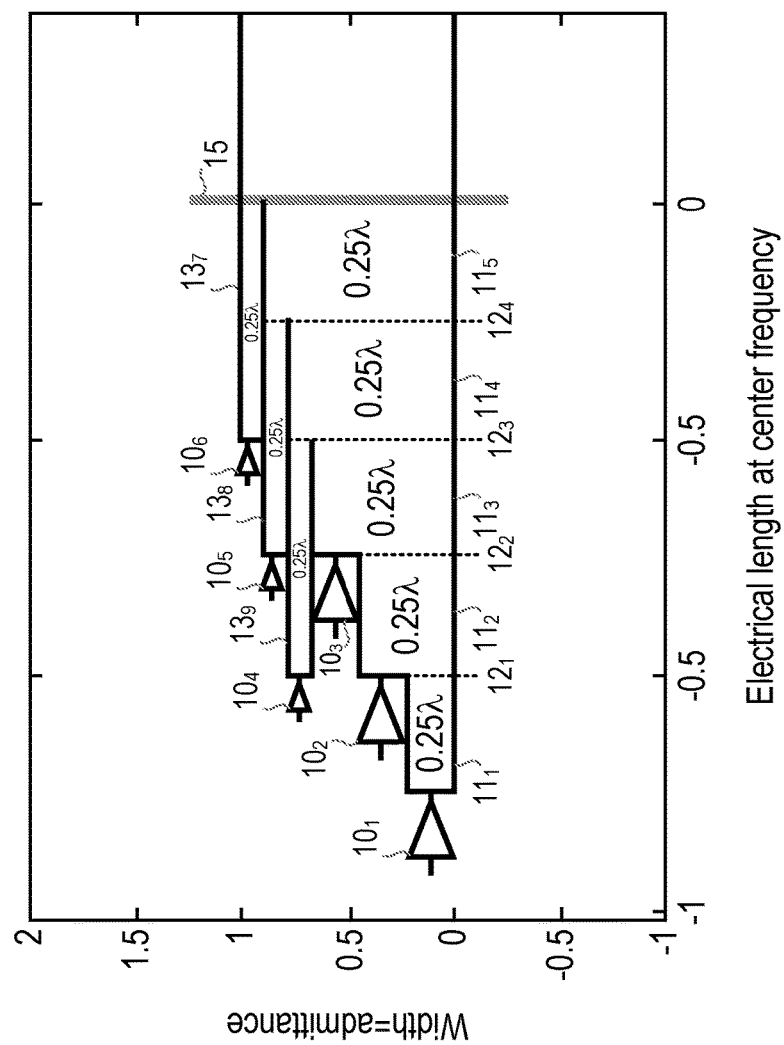
FIG. 12a shows an example of an amplifier arrangement according to another embodiment.
Figure 12B:
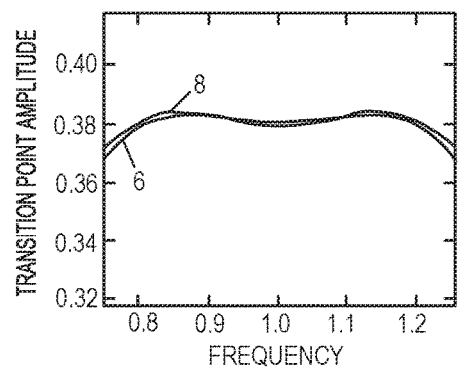
Figure 12C:
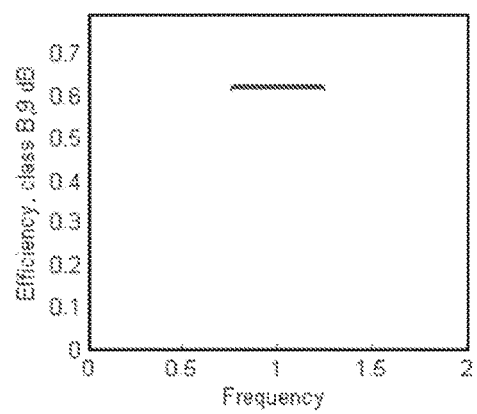
Figure 12D:
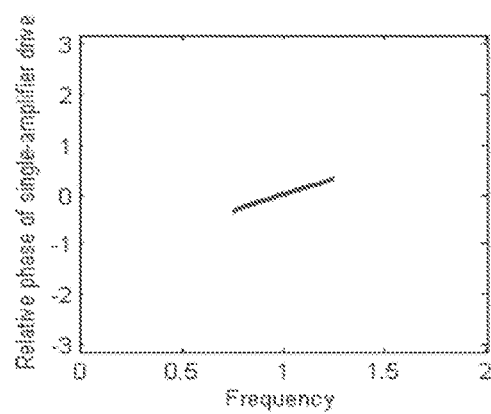

FIG. 12a shows an example of another embodiment. At least two peaking amplifiers are configured to be driven by time-delayed versions of the same signal. The example of FIG. 12a is similar to that of FIG. 11a, but instead of having just one half wavelength transmission line $13_7$ between the amplifier stage $10_6$ and the output 15, according to this embodiment half wavelength transmission lines $13_9$ and $13_8$ are also inserted between each of amplifier stages $10_4$ and $10_5$ and their respective junctions of the main cascade of quarter wavelength transmission lines. With half wavelength lines at the last three peaking sub-amplifiers the response is improved within a 50% bandwidth, as shown in FIG. 12b. FIG. 12c shows the efficiency at the transition point peaks and FIG. 12d the required relative phase angle variation for the embodiment of FIG. 12a.

Thus, according to this embodiment the amplifier arrangement comprises six amplifier stages $10_1$ to $10_6$, and the main cascade of quarter wavelength transmission lines comprises five stages $11_1$ to $11_5$. The main amplifier $10_2$ and the first and second peaking amplifiers $10_1$, $10_3$ are substantially double the size of the remaining peaking amplifiers $10_4$ to $10_6$, the third peaking amplifier $10_4$ is coupled to its respective junction $12_3$ of the main cascade of quarter wavelength transmission lines via a half wavelength transmission line $13_9$, or multiples of half wavelength transmission lines, the fourth peaking amplifier $10_5$ is coupled to its respective junction $12_4$ of the main cascade of quarter wavelength transmission lines via a half wavelength transmission line $13_8$, or multiples of half wavelength transmission lines, and the fifth peaking amplifier $10_6$ is coupled to the output 15 via a half wavelength transmission line $13_7$, or multiples of half wavelength transmission lines.

It is noted that other combinations may also be used without departing from the scope of the invention as defined in the dependent claims.

In each of the embodiments described herein, it is noted that any of the half wavelength lines may be replaced by an alternative, whereby a sectioned line consisting of two quarter wavelength lines with peaking amplifiers at both the end and the junction between them is provided. Since the total length is a half wavelength, it can be used in the same way as the half wave lines in the previous examples, and since it has another pattern of reactance over frequency, it may improve the bandwidth or ripple in some cases (although a higher number of sub-amplifiers are required).

Figure 13A:
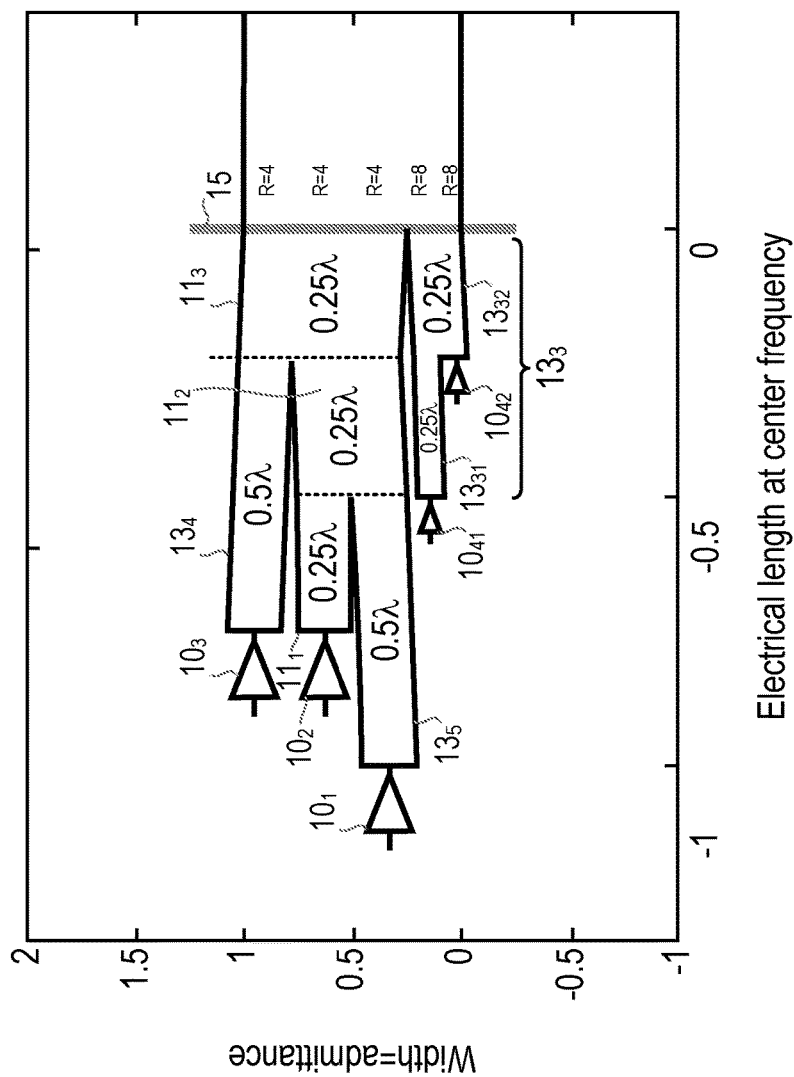
FIG. 13a shows an example of an amplifier arrangement according to another embodiment.

An example of such an alternative is shown in FIG. 13a, which results in a five-stage amplifier because of the additional amplifier required compared to the four-stage amplifier.

The embodiment of FIG. 13a is similar to the four-stage amplifier of FIG. 7a, in which half wavelength transmission lines $13_3$, $13_4$ and $13_5$ are coupled to the output of each of the peaking sub-amplifiers $10_1$, $10_3$ and $10_4$ respectively in FIG. 7a. At least two peaking amplifiers are configured to be driven by time-delayed versions of the same signal.

In the alternative example of FIG. 13a, however, the last peaking amplifier $10_4$ and its half wavelength transmission line $13_3$ to the output 15 has been replaced by the two sub-amplifiers $10_{41}$ and $10_{42}$, and the two quarter wavelength sectioned line, labelled $13_{31}$ and $13_{32}$. It is noted that the characteristic impedance of the two quarter wavelength sections are double the characteristic impedance of the main cascade of quarter wavelength transmission lines $11_1$, $11_2$ and $11_3$, (indicated by R=4 for the main cascade, and R=8 for the two sections of quarter wavelengths $13_{31}$ and $13_{32}$ in FIG. 13a, which are being used to realise the half wavelength transmission line $13_3$ of FIG. 7a).

Thus, according to some embodiments a half wavelength transmission line comprises a single half wavelength transmission line, while in other embodiments at least one half wavelength transmission line comprises a sectioned quarter wavelength transmission line cascade comprising first and second stages $13_{31}$ and $13_{32}$, each of the first and second stages coupled to receive first and second amplifiers $10_{41}$ and $10_{42}$. In one example the first and second amplifiers are reduced in size in comparison to other amplifiers in the amplifier arrangement, and wherein the characteristic impedance of the first and second stages $13_{31}$ and $13_{32}$ is increased by a corresponding ratio compared to the stages $11_1$ to $11_N$ in the main cascade of quarter wavelength transmission lines. In other words, an increase in impedance of a narrower transmission line is accompanied by a decrease, i.e. required output current, of the corresponding amplifier transistor, or vice versa.

Using half wavelength lines can be used as a method for absorbing parasitic capacitance and/or inductance. This is possible since a part of the half wave line can be replaced by a synthetic transmission line that uses the parasitic element as a circuit component. The simplest networks that achieve this are the L-types, for example consisting of a shunt capacitor (that can be the entire or a part of the parasitic output capacitance of the transistor) and a series inductor, for example a bond wire or a short section of transmission line.

It is noted that at least one of the first and second amplifiers $10_{41}$ and $10_{42}$ may itself be coupled to a respective junction of the sectioned quarter wavelength transmission line cascade via a half wavelength transmission line or multiples of half wavelength transmission lines.

Figure 13B:
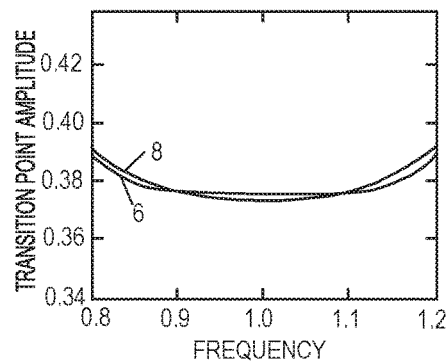
Figure 13C:
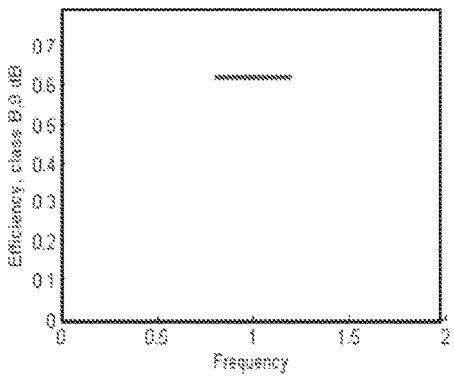
Figure 13D:
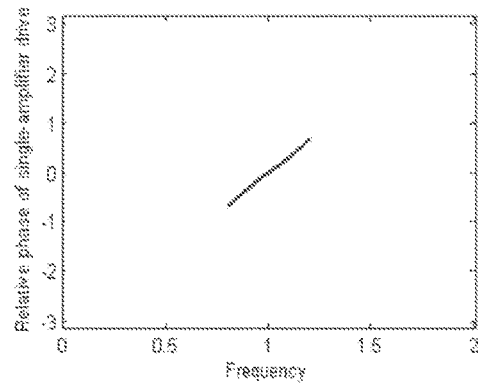

FIG. 13b shows the variation in transition point amplitude, FIG. 13c the efficiency at the transition point peaks and FIG. 13d the required relative phase angle variation for the embodiment of FIG. 13a.

FIG. 14 shows an example of an embodiment comprising a five-stage amplifier arrangement for 50% bandwidth. At least two peaking amplifiers are collectively driven by time-delayed versions of the same signal. The amplifier arrangement comprises a main cascade of quarter wavelength transmission lines, having four stages $11_1$, $11_2$, $11_3$ and $11_4$. Each of the peaking amplifiers $10_1$, $10_3$, $10_4$ and $10_5$ is coupled by a respective half wavelength transmission line $13_{10}$, $13_{11}$, $13_{12}$ and $13_{13}$. However, in this embodiment, the sizes of the sub-amplifiers and their corresponding half wavelength line impedances have been optimized while considering the reactive loading effect of the half wavelength lines. This is illustrated by the different amplifier sizes and the different impedances "R". It is noted that these values are examples only, and the actual values will depend on a given application.

Figure 14A:
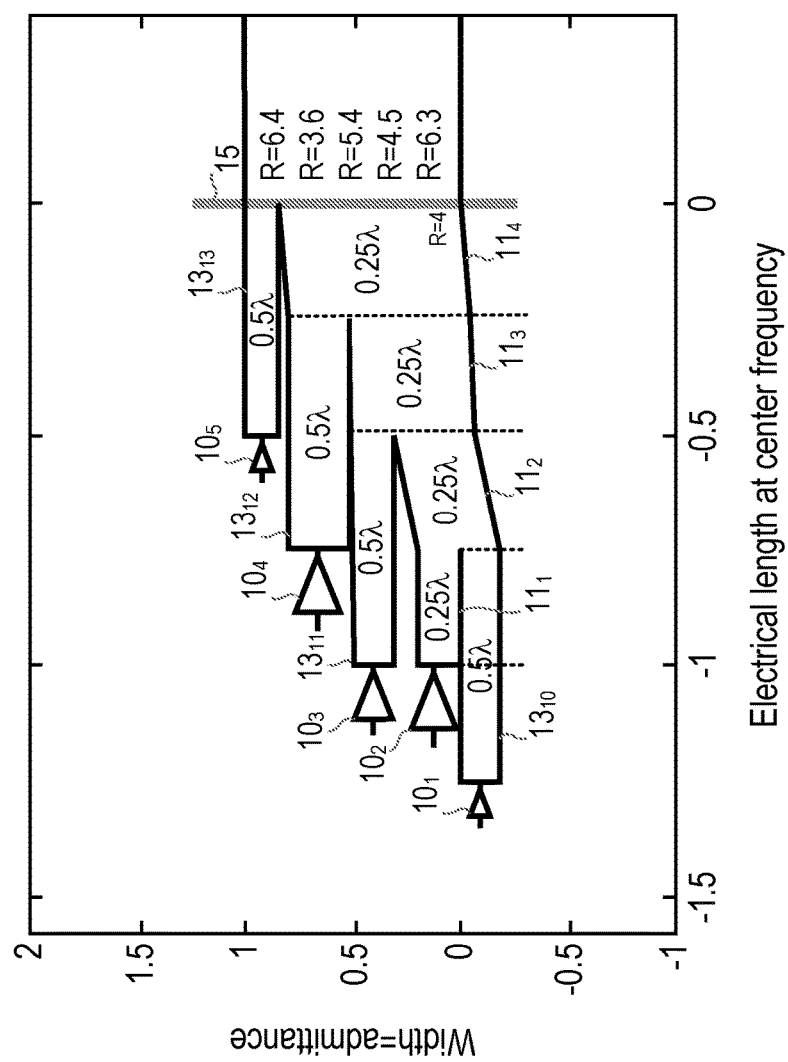
FIG. 14a shows an example of an amplifier arrangement according to another embodiment.
Figure 14B:
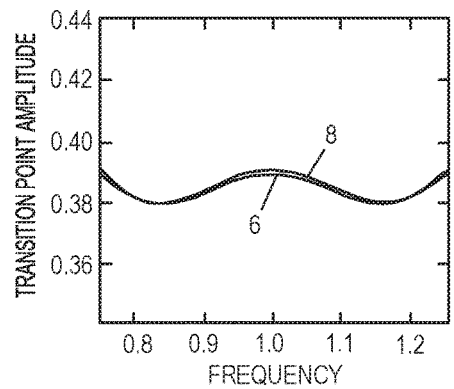
Figure 14C:
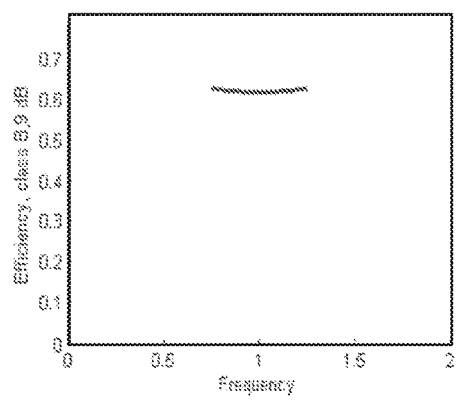
Figure 14D:
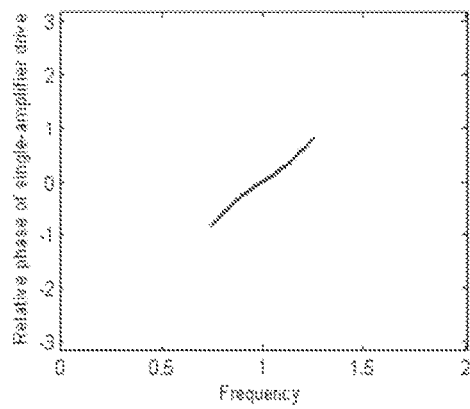

FIG. 14b shows the variation in transition point amplitude, FIG. 14c the efficiency at the transition point peaks and FIG. 14d the required relative phase angle variation for the embodiment of FIG. 14a.

Compared to an amplifier without the half wavelength lines this amplifier may have a somewhat worse response, however with free amplifier sizing the response may be improved by increasing the number of peaking amplifier stages.

Figure 15A:
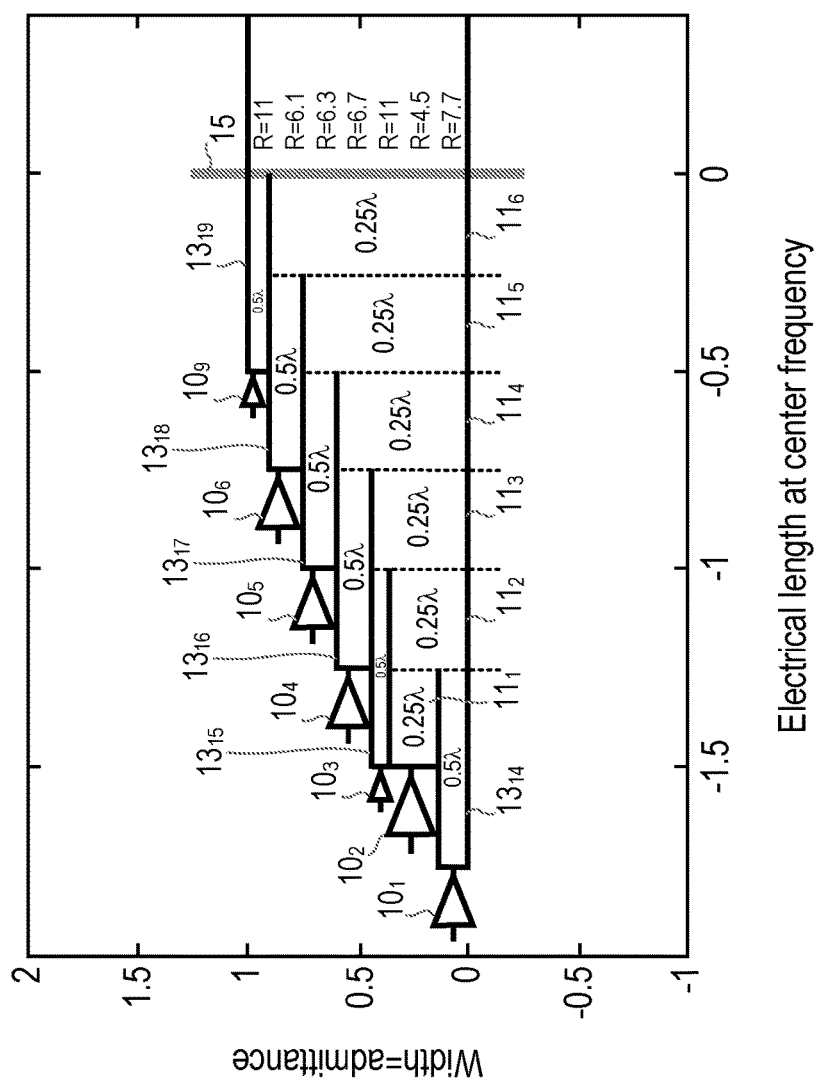
FIG. 15a shows an example of an amplifier arrangement according to another embodiment.

For example, FIG. 15a shows an example of an embodiment comprising a seven-stage amplifier arrangement. At least two peaking amplifiers are collectively driven by time-delayed versions of the same signal. The amplifier arrangement comprises a main cascade of quarter wavelength transmission lines, having six stages $11_1$, $11_2$, $11_3$, $11_4$, $11_5$ and $11_6$. Each of the peaking amplifiers $10_1$, $10_3$, $10_4$, $10_5$, $10_6$ and $10_7$ is coupled by a respective half wavelength transmission line $13_{14}$, $13_{15}$, $13_{16}$, $13_{17}$, $13_{18}$ and $13_{19}$. However, in this embodiment, in a similar manner to the embodiment of FIG. 14a the sizes of the sub-amplifiers and their corresponding half wavelength line impedances have been optimized while considering the reactive loading effect of the half wavelength lines. This is illustrated by the different amplifier sizes and the different impedances "R". It is noted that these values are examples only, and the actual values will depend on a given application.

Figure 15B:
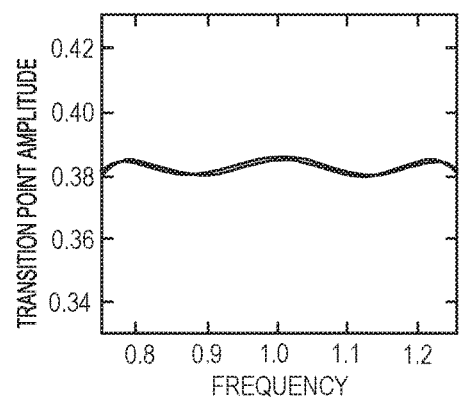
Figure 15C:
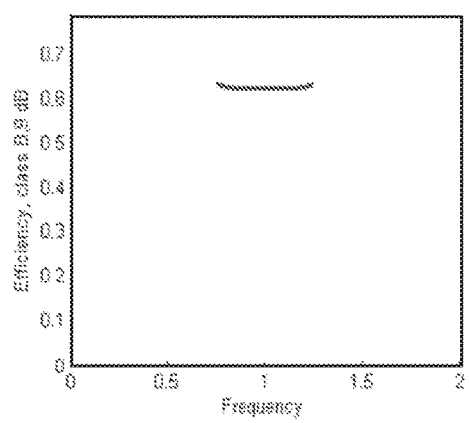
Figure 15D:
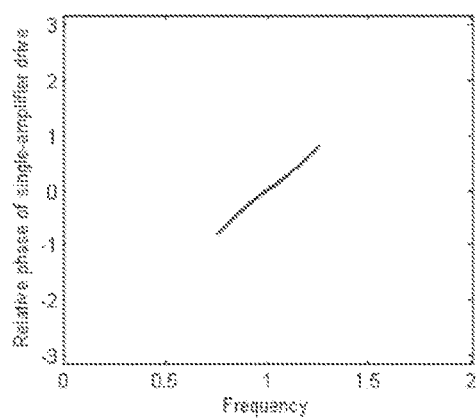

FIG. 15b shows the variation in transition point amplitude, FIG. 15c the efficiency at the transition point peaks and FIG. 15d the required relative phase angle variation for the embodiment of FIG. 15a. It can be seen that the transition point ripple of the seven-stage embodiment of FIG. 15a is lower than for the embodiment of the five-stage version of FIG. 14a.

Therefore, the embodiments of FIGS. 14a and 15a, in which each peaking amplifier is coupled via a half wavelength transmission line, comprises a method in which the sizes of each of the amplifiers and their corresponding half wavelength line impedances are selected in relation to a reactive loading effect of the half wavelength transmission lines.

A further consideration for the embodiments described herein is that the voltage of any of the peaking sub-amplifiers in response to the driven (main) sub-amplifier may be held below a certain limit, often determined by breakdown. This can be a factor that determines a frequency limit of an amplifier arrangement. An example of one way to express this is that the transimpedance magnitude from the main amplifier to any of the peaking amplifiers is configured such that it is not higher than the self-impedance at the main amplifier (over the entire bandwidth).

Figure 16A:
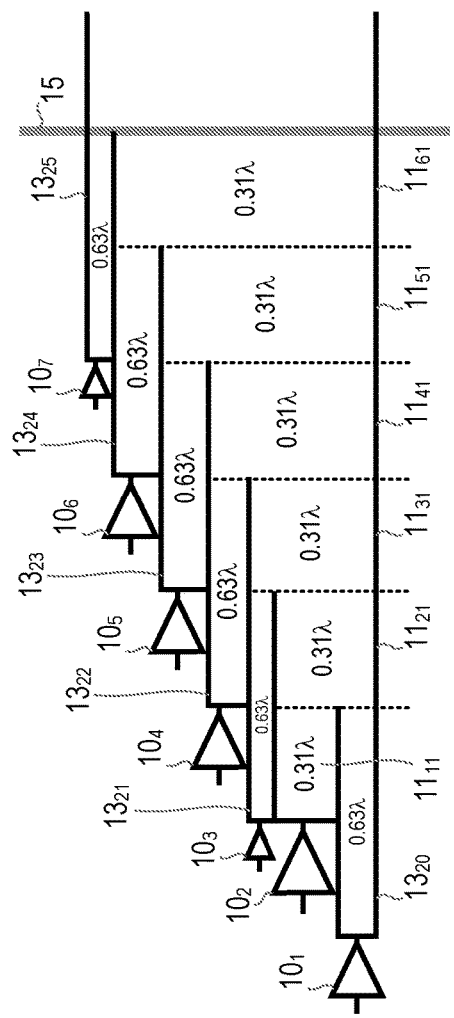
FIG. 16a shows an example of an amplifier arrangement according to another embodiment.
Figure 16B:
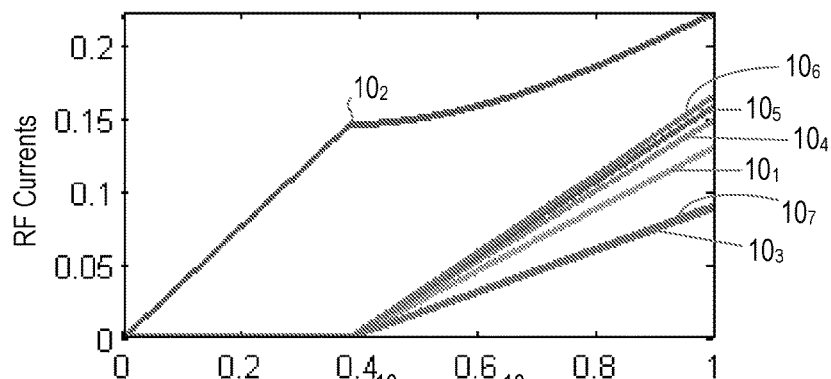

FIG. 16a shows an example of the voltages and currents involved in an embodiment when operating away from center frequency. For example, at a higher frequency of 1.25 times the centre frequency, the electrical length of the same physical transmission lines as the previous embodiments (e.g. 0.25λ and 0.5λ) increase to the values shown in the example of FIG. 16a (i.e. 0.31λ and 0.63λ respectively). Each section of the main cascade of transmission lines $11_{11}$, $11_{21}$, $11_{31}$, $11_{41}$, $11_{51}$ and $11_{61}$ therefore effectively comprises a section of 0.31λ transmission line, with 0.63λ transmission lines coupled between peaking amplifiers and their corresponding junction of the cascade or output. Thus, although the main embodiments are described as operating at a main center frequency (with electrical lengths of the transmission lines being 0.25λ or 0.5λ when operating at this centre frequency), it is noted that the embodiments described herein may be operated off-centre, since the wideband nature of these circuits allow this.

Figure 16C:
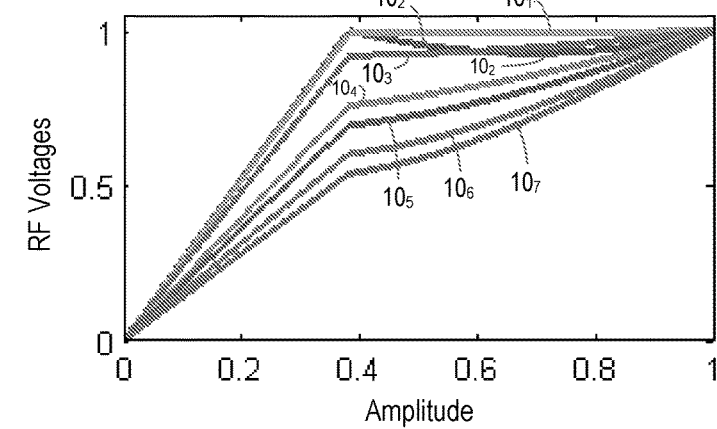
Figure 16D:
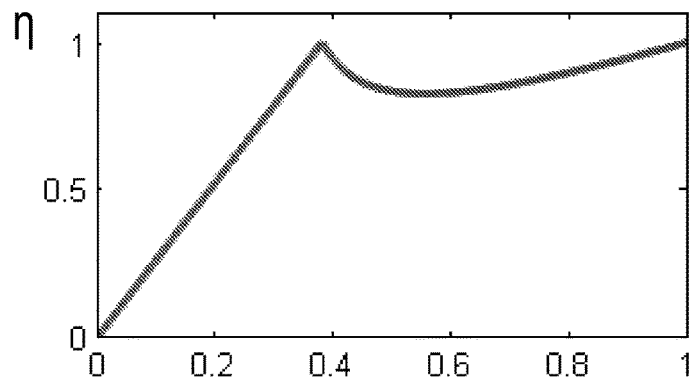
Figure 16E:
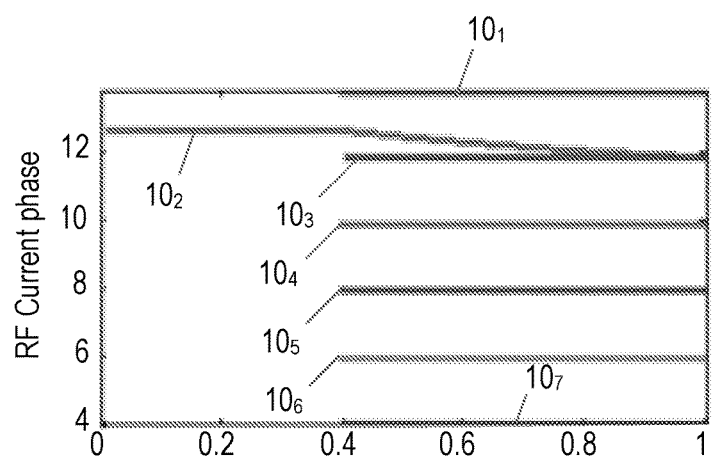
Figure 16F:
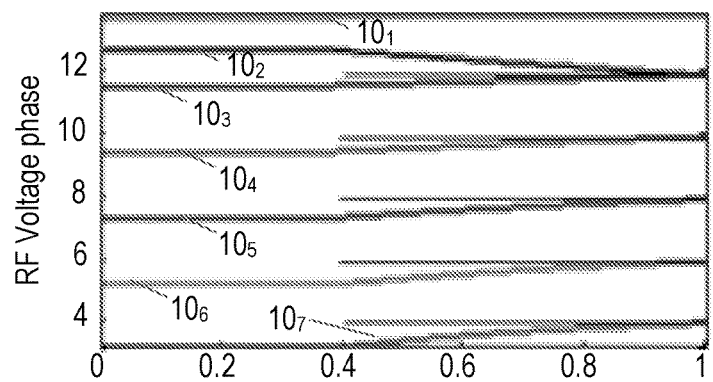

The RF voltage response at the upper band edge is shown in FIG. 16c. The voltage at the first peaking amplifier is as high here as the voltage at the main amplifier at the transition point, and it may be higher if left unchecked in the design process. It is therefore noted that in this example an upper limit has been used on the transimpedances in the optimization, in order to avoid the RF voltages being too high at some peaking amplifiers. The upper limit may be provided in the design process to help counteract the effort to obtain higher bandwidth or less ripple.

The high efficiency of the embodiments of the present invention may be obtained, for example, if high-efficiency waveforms are used, such as class B or class F. For amplifiers with very large bandwidths this may require appropriate designs, such as push-pull coupled amplifiers. The embodiments of the invention may be implemented fully differentially in such cases, so that a balun is only used at the output. Other implementations are also feasible, and the specific circuit techniques used may depend on the bandwidth and other requirements. The most appropriate topology to use may depend in many cases upon the implementation details of these networks, since these also affect the wideband reactance pattern and transformation properties at the output of the sub-amplifier transistors.

The half wavelength insertions described in the embodiments herein can be used together with other methods, for example stubs or resonators that are not connected to sub-amplifiers. The present method can in such cases lessen the negative impact on wideband peak power output that such methods generally have, and the combination could in some cases be better than either basic method by itself.

It can be seen from the various embodiments described above that the examples of the present invention are useful for constructing wideband Doherty amplifiers with high efficiency. The embodiments may be especially useful when arbitrary sized sub-amplifiers cannot be used, for example when only one size of transistor is available. These amplifiers may have very consistent properties over large bandwidths, which simplifies implementation of the control and drive circuits. The embodiments may also be used as a method for absorbing parasitic capacitance and/or inductance. Static gain and bias settings can be used, which results in simple input side circuits.

It can be seen from the above that the embodiments described herein comprise modified multistage Doherty amplifier arrangements in which at least two peaking amplifiers are collectively driven by time-delayed versions of the same signal, for example driven with the same amplitude function (typically obtained by class C biasing in the peaking amplifiers themselves or in one or more driver stages), with the higher transition points being unused. To obtain consistent transition point amplitude and high efficiency over a relatively wide bandwidth, half wavelength lines are used either to connect (some or all) sub-amplifiers to their respective junctions, or to change a quarter wavelength line in a quarterwave cascade to three quarter wavelengths (or five, or some other odd number), or a combination of both these techniques.

Low variations in transition point amplitude and low reactance at the main-sub-amplifier give high efficiency and allows very simple input side signal conditioning. High variations means that circuits that follow these transition-point variations over frequency can be used in order to obtain high efficiency and at the same time not drive the amplifier in too deep and frequency-dependent saturation, which otherwise can cause problems for pre-distortion circuitry.

These extensions add reactances at the junctions that can make the transforming action of the quarter wavelength cascade more wideband. The reactance magnitude decreases with the frequency offset from being very high at center frequency. Its effect therefore increases with frequency offset, since the reactance is in parallel with the transmission line. Generally, longer lines (more half wavelengths inserted) increase the effects, but at the same time limits the possible bandwidth of high efficiency. The strictest limitation is due to the series-resonance at the frequencies where a line is a quarter wavelength, which short-circuits the quarter wavelength cascade at that point. A weaker effect is due to the lack of transformation at frequencies where for example an intended three quarter wave line becomes a multiple of a half wavelength.

To obtain wideband performance in the transformation of the load resistance, the reactances from different parts of the circuit can be arranged to cancel each other in their contribution at the main sub-amplifier. Since half wave insertions are used, these reactances are mainly changeable in discrete steps (but vary with frequency). Loosening the requirements of the in-phase combining criterion (as described in the paragraph below), enables continuous adjustments to be carried out, if desired. Pre-calculating the effect of reactances from half-wave lines at each junction is an example of one method that may be used to determine the most optimal combinations. For amplifiers with low numbers of sub-amplifiers, a full search in a circuit simulator may also be feasible.

In-phase combination to the sum of maximum output powers of any number of sub-amplifiers is possible, over any bandwidth. The requirement is that the admittance sums in any junction of transmission lines is the same going in as going out (towards the output), and that all incoming waves (from successively more sub-amplifiers) are in phase at the junctions. To achieve full output power while optimally loading each amplifier, all sub-amplifiers can be configured to have optimal load resistances (for full output) that are matched to the admittance or admittance difference between the transmission line sections lines at the junctions in the in the quarter wavelength cascade. Thus, according to some embodiments, the quarter or half wavelength transmission lines that connect the sub-amplifiers to the junctions may have characteristic impedances that are equal to those optimal load resistances.

The timing of the drive signals to the peaking amplifiers may be offset by the same time as the travel time for the wave across all prior transmission line sections. An example of an input side network for managing this is presented in co-pending application reference P43345 by the present Applicant. The input side arrangements for the main sub-amplifier depend on the required phase response over frequency for the single-amplifier drive signal.

The embodiments of the invention may be implemented with different numbers of sub-amplifiers N, for example three or more amplifiers. The discrete nature of the half wavelength insertions means that an amplifier with a lower number of sub-amplifiers is sometimes better than one with more sub-amplifiers. For equal size sub-amplifiers, a certain number of sub-amplifiers can dictate the transformation in the middle of the band, and therefore also the transition point amplitude there. Having the possibility to parallel combine at least two transistors for some sub-amplifiers increases the freedom to place the transition point at an amplitude that gives the highest efficiency with the signal amplitude distribution at hand.

In the embodiments described above, it is noted that a characteristic impedance of a transmission line (for example of the main cascade of quarter wavelength transmission lines, or of the half wavelength transmission lines) is represented by the relative thicknesses of the transmission lines (the smaller the thickness the higher the characteristic impedance, and vice versa, which are labelled "R" in the various diagrams).

It is noted that the embodiments of the invention also have an advantage in that the amplifier arrangements have a lower amount of load modulation (lower RF current increases with amplitude above the transition point). This can have the advantage of providing lower loss sensitivity and improved class F operation.

The embodiments described herein have the advantage of increasing bandwidth, or increasing performance over a specific bandwidth.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An amplifier arrangement, comprising:
   N amplifier stages coupled to an output impedance network, the output impedance network comprising a cascade of quarter wavelength transmission lines;
   a main amplifier and a plurality of peaking amplifiers configured to operate in a Doherty mode of operation;
   wherein the amplifier arrangement is configured such that at least two peaking amplifiers are collectively driven by time-delayed versions of the same signal; and
   at least one of the following is true:
      at least one of the quarter wavelength transmission lines of the cascade is extended by a half wavelength transmission line or multiples of half wavelength transmission lines;
      at least one of the peaking amplifiers is coupled to a respective junction or output node of the cascade via a connecting half wavelength transmission line or multiples of half wavelength transmission lines;
   wherein the output impedance network comprises a cascade of quarter wavelength transmission lines coupled between an output of the main amplifier of the N amplifier stages and an output node of the amplifier arrangement;
   wherein the cascade comprises N−1 quarter wavelength transmission lines; and
   wherein an output of one peaking amplifier of the N amplifier stages is coupled to the output node, and remaining peaking amplifiers of the N amplifier stages coupled to respective junctions in the main cascade of quarter wavelength transmission lines.

2. The amplifier arrangement of claim 1:
   wherein the amplifiers are substantially equally sized; or
   wherein at least one amplifier is sized differently to the remaining amplifiers.

3. The amplifier arrangement of claim 1:
wherein an impedance of each section of the cascade of quarter wavelength transmission lines is substantially equal; or
wherein at least one section of the cascade of quarter wavelength transmission lines comprises an impedance which is different to the remaining sections of the cascade.

4. The amplifier arrangement of claim 1, wherein each of the peaking amplifiers is coupled to a respective junction or output node of the cascade via a connecting half wavelength transmission line or multiples of half wavelength transmission lines.

5. The amplifier arrangement of claim 1, wherein a half wavelength transmission line comprises:
a single half wavelength transmission line; or
a sectioned quarter wavelength transmission line cascade comprising first and second stages, each of the first and second stages coupled to receive first and second amplifiers.

6. The amplifier arrangement of claim 5, wherein at least one of the first and second amplifiers is coupled to a respective junction of the sectioned quarter wavelength transmission line cascade via a half wavelength transmission line or multiples of half wavelength transmission lines.

7. The amplifier arrangement of claim 1:
wherein the amplifier arrangement comprises four amplifier stages; and
wherein a second section of the cascade of quarter wavelength transmission lines is extended by a half wavelength transmission line or multiples of half wavelength transmission lines.

8. The amplifier arrangement of claim 1:
wherein the amplifier arrangement comprises four amplifier stages; and
wherein a first peaking amplifier is coupled to its respective junction of the cascade of quarter wavelength transmission lines via a half wavelength transmission line or multiples of half wavelength transmission lines.

9. The amplifier arrangement of claim 1, wherein:
the amplifier comprises four amplifier stages;
a first peaking amplifier is coupled to its respective junction of the cascade of quarter wavelength transmission lines via a half wavelength transmission line or multiples of half wavelength transmission lines;
a second peaking amplifier is coupled to its respective junction of the cascade of quarter wavelength transmission lines via a half wavelength transmission line or multiples of half wavelength transmission lines; and
a third peaking amplifier is coupled to the output node via a half wavelength transmission line or multiples of half wavelength transmission lines.

10. The amplifier arrangement of claim 9, wherein a second section of the cascade of quarter wavelength transmission lines is extended by a half wavelength transmission line or multiples of half wavelength transmission lines.

11. The amplifier arrangement of claim 1, wherein a characteristic impedance of each successive stage in the cascade of quarter wavelength transmission lines is reduced towards the output node in relation to the parallel combination of preceding connecting transmission lines, whereby an outgoing transmission line has an admittance that is the sum of all incoming admittances.

12. The amplifier arrangement of claim 1, wherein a characteristic impedance of each of the half wavelength transmission lines is substantially equal.

13. The amplifier arrangement of claim 1, wherein:
the amplifier comprises six amplifier stages;
the cascade of quarter wavelength transmission lines comprises five stages;
the main amplifier and first and second peaking amplifiers are substantially double the size of the remaining peaking amplifiers; and
a fifth peaking amplifier is coupled to the output node via a half wavelength transmission line or multiples of half wavelength transmission lines.

14. The amplifier arrangement of claim 1, wherein the main amplifier and first and second peaking amplifiers are substantially double the size of any remaining peaking amplifiers.

15. The amplifier arrangement of claim 14, wherein:
the amplifier comprises six amplifier stages;
the main cascade of quarter wavelength transmission lines comprises five stages;
a third peaking amplifier is coupled to its respective junction of the cascade of quarter wavelength transmission lines via a half wavelength transmission line or multiples of half wavelength transmission lines;
a fourth peaking amplifier is coupled to its respective junction of the cascade of quarter wavelength transmission lines via a half wavelength transmission line or multiples of half wavelength transmission lines;
a fifth peaking amplifier is coupled to the output node via a half wavelength transmission line or multiples of half wavelength transmission lines; and
the main amplifier and first and second peaking amplifiers are substantially double the size of the third, fourth and fifth peaking amplifiers.

16. The amplifier arrangement of claim 1, wherein:
each peaking amplifier is coupled via a half wavelength transmission line to its respective junction in the cascade of quarter wavelength transmission lines or output node; and
the sizes of each of the amplifiers and their corresponding half wavelength line impedances are optimized in relation to a reactive loading effect of the half wavelength transmission lines.

17. The amplifier arrangement of claim 1, wherein:
the amplifier arrangement is configured to operate at center frequency, or
the amplifier is configured to operate away from center frequency.

18. A method of improving the efficiency of an amplifier arrangement comprising N amplifier stages coupled to an output impedance network, the impedance network comprising a cascade of quarter wavelength transmission lines, wherein the amplifier arrangement comprises a main amplifier and a plurality of peaking amplifiers configured to operate in a Doherty mode of operation, the method comprising:
collectively driving at least two peaking amplifiers by time-delayed versions of the same signal;
at least one of:
extending at least one of the quarter wavelength transmission lines in the cascade by a half wavelength transmission line or multiples of half wavelength transmission lines;
coupling at least one of the peaking amplifiers to its respective junction or an output node via a connecting half wavelength transmission line or multiples of half wavelength transmission lines;
wherein the output impedance network comprises a cascade of quarter wavelength transmission lines coupled between an output of the main amplifier of the N amplifier stages and an output node of the amplifier arrangement;

wherein the cascade comprises N−1 quarter wavelength transmission lines; and wherein an output of one peaking amplifier of the N amplifier stages is coupled to the output node, and remaining peaking amplifiers of the N amplifier stages coupled to respective junctions in the main cascade of quarter wavelength transmission lines.

19. The method of claim 18:

wherein each peaking amplifier is coupled via a half wavelength transmission line;

further comprising selecting the sizes of each of the amplifiers and/or their corresponding half wavelength line impedances in relation to a reactive loading effect of the half wavelength transmission lines.

\* \* \* \* \*